(12) United States Patent
Momohara

(10) Patent No.: US 6,518,073 B2
(45) Date of Patent: *Feb. 11, 2003

(54) METHOD FOR TESTING SEMICONDUCTOR MEMORY DEVICES, AND APPARATUS AND SYSTEM FOR TESTING SEMICONDUCTOR MEMORY DEVICES

(75) Inventor: Tomomi Momohara, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/988,834

(22) Filed: Dec. 10, 2001

(65) Prior Publication Data

US 2002/0039799 A1 Apr. 4, 2002

Related U.S. Application Data

(60) Continuation of application No. 09/583,015, filed on May 30, 2000, now Pat. No. 6,335,209, which is a division of application No. 08/785,288, filed on Jan. 23, 1997, now Pat. No. 6,094,733.

(30) Foreign Application Priority Data

Jan. 25, 1996 (JP) ............................................. 8-011029

(51) Int. Cl.[7] .............................................. H01L 21/00
(52) U.S. Cl. ................................ 438/4; 438/12; 438/18
(58) Field of Search ............................ 438/4, 5, 10, 11, 438/12, 17, 18

(56) References Cited

U.S. PATENT DOCUMENTS

| 5,436,559 A | 7/1995 | Takagi et al. ............. 324/158.1 |
| 5,543,334 A | 8/1996 | Yoshi et al. .................. 438/17 |
| 5,602,044 A | 2/1997 | Rouy ............................. 438/4 |
| 5,675,544 A | 10/1997 | Hashimoto .................. 365/201 |
| 5,795,797 A | 8/1998 | Chester et al. ................. 438/4 |
| 5,859,804 A | 1/1999 | Hedberg et al. ............ 365/201 |
| 6,335,209 B1 * | 1/2002 | Momohara ..................... 438/4 |

FOREIGN PATENT DOCUMENTS

JP          6-202961          7/1994

OTHER PUBLICATIONS

T. Satou et al. "Tester for Memories", Guidebook on Apparatuses for Manufacturing and Testing Apparatuses, Dec. 1995, pp. 148–153.

* cited by examiner

Primary Examiner—Chandra Chaudhari
(74) Attorney, Agent, or Firm—Finnegan, Henderson, Farabow, Garrett & Dunner, L.L.P.

(57) ABSTRACT

A method for testing a semiconductor device comprises executing a function test on the semiconductor device, executing a DC characteristic test on the semiconductor device, executing a remedy determination process of the semiconductor device, and executing a remedy process on the semiconductor device. The remedy determination process is performed in parallel to the DC test.

24 Claims, 22 Drawing Sheets

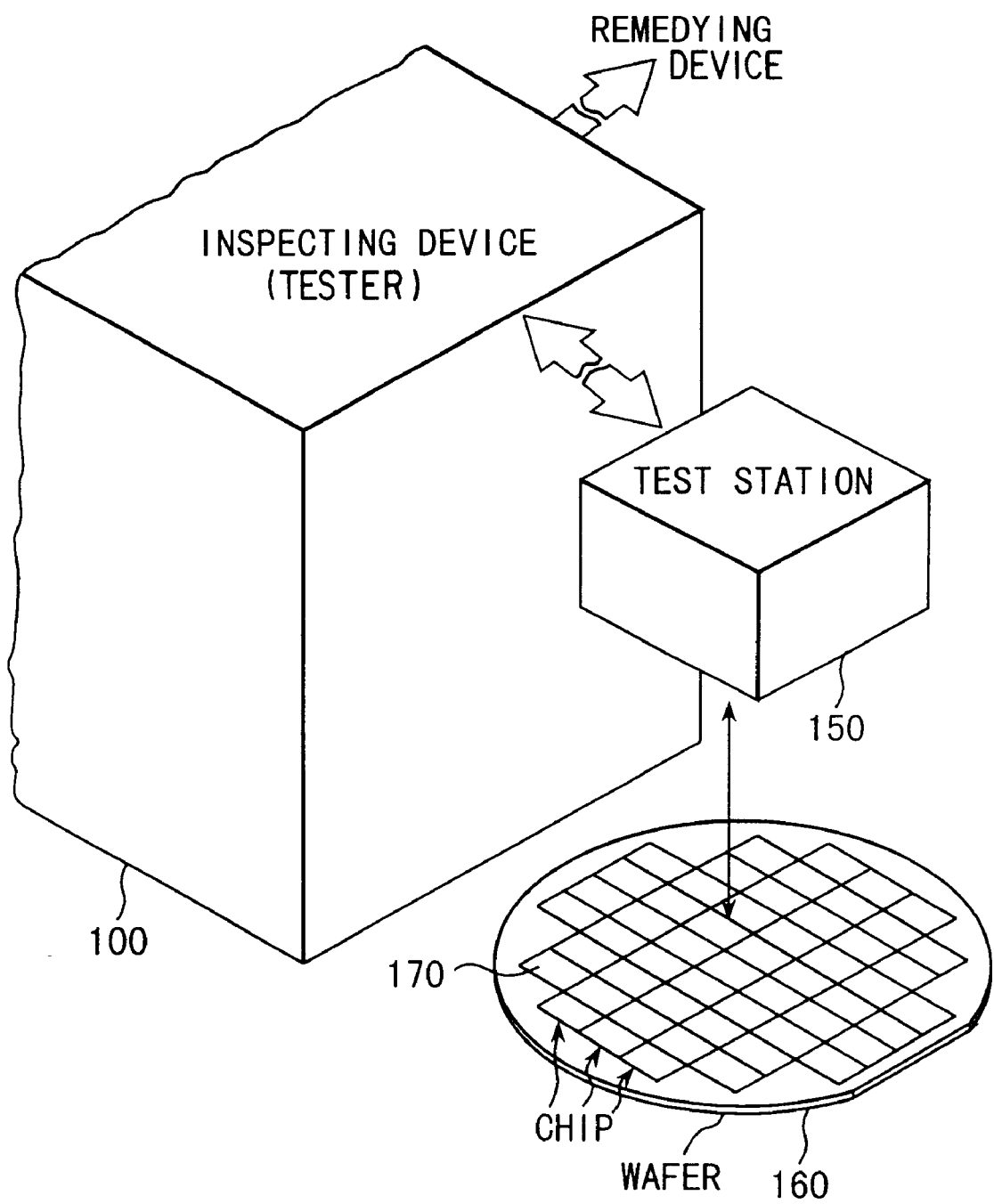
F I G. 10

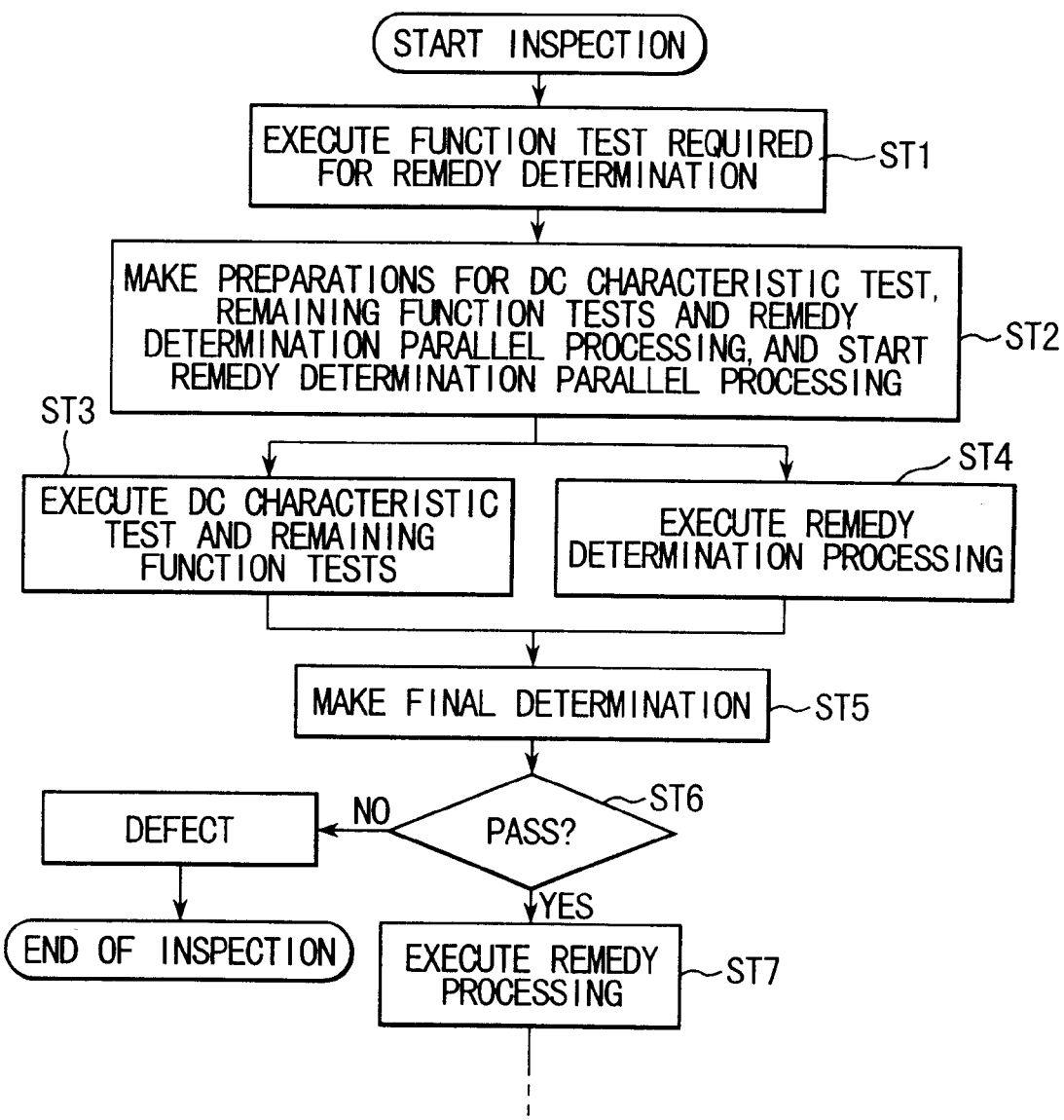
F I G. 14

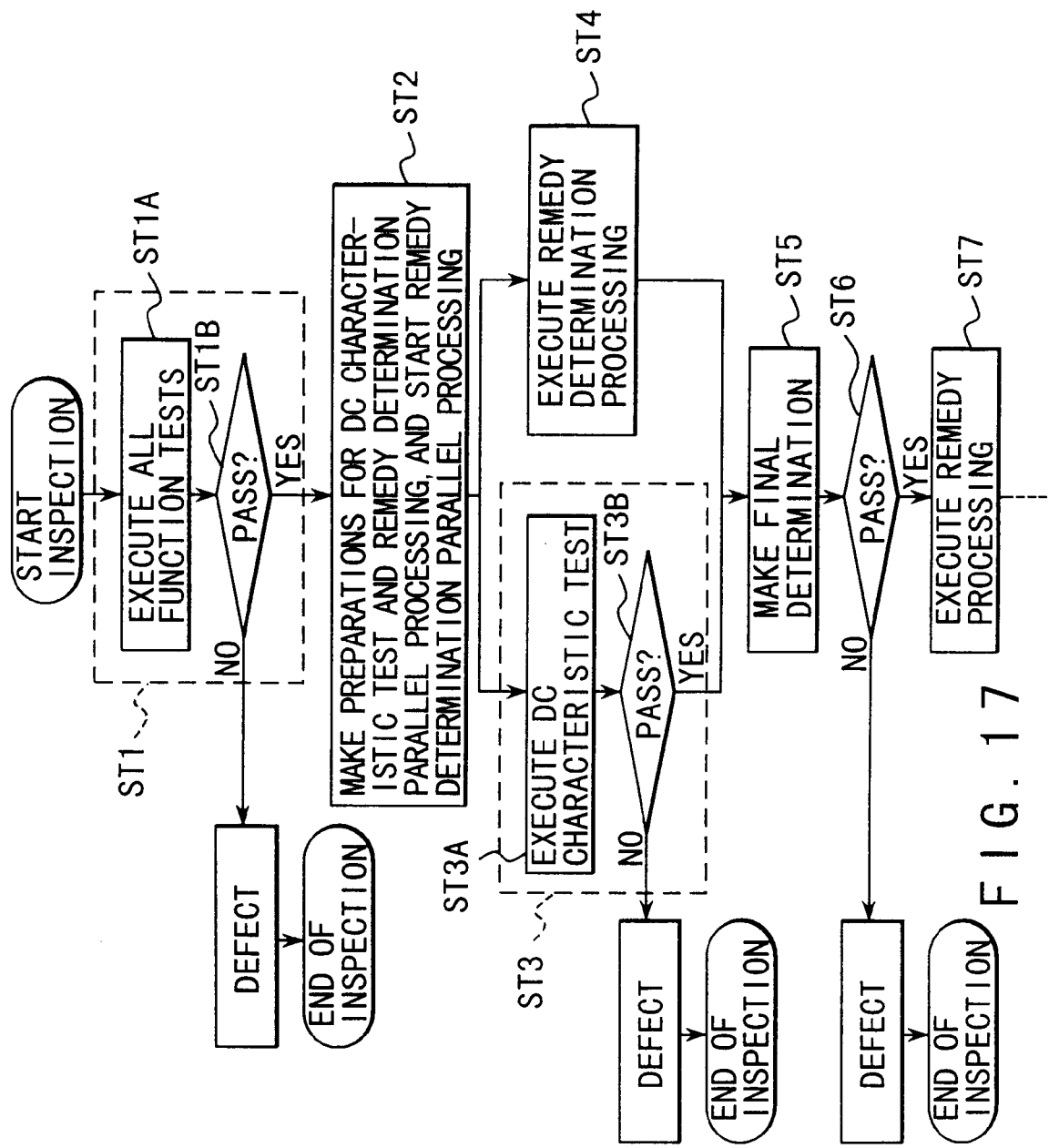
F I G. 17

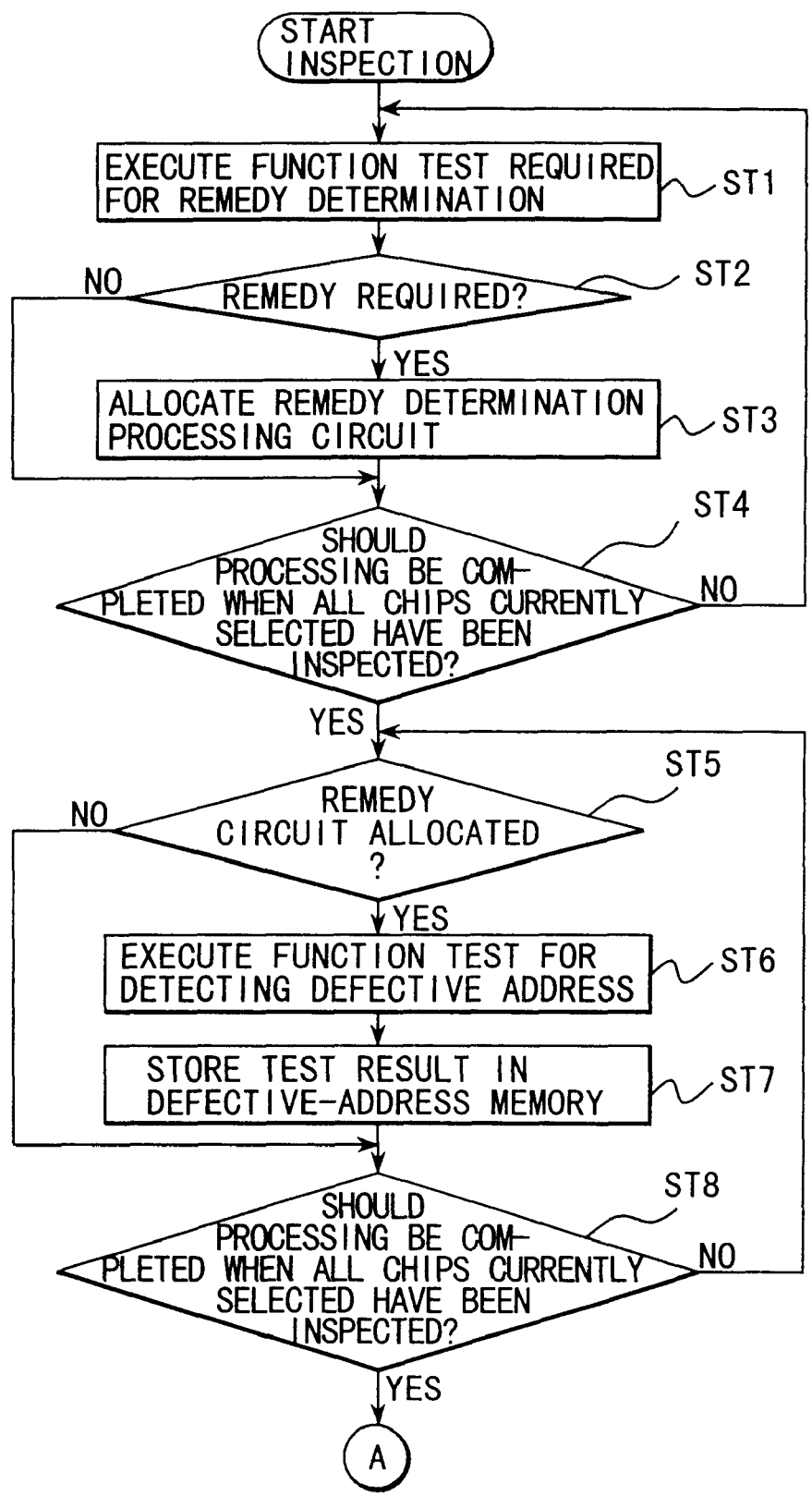
F I G. 21A

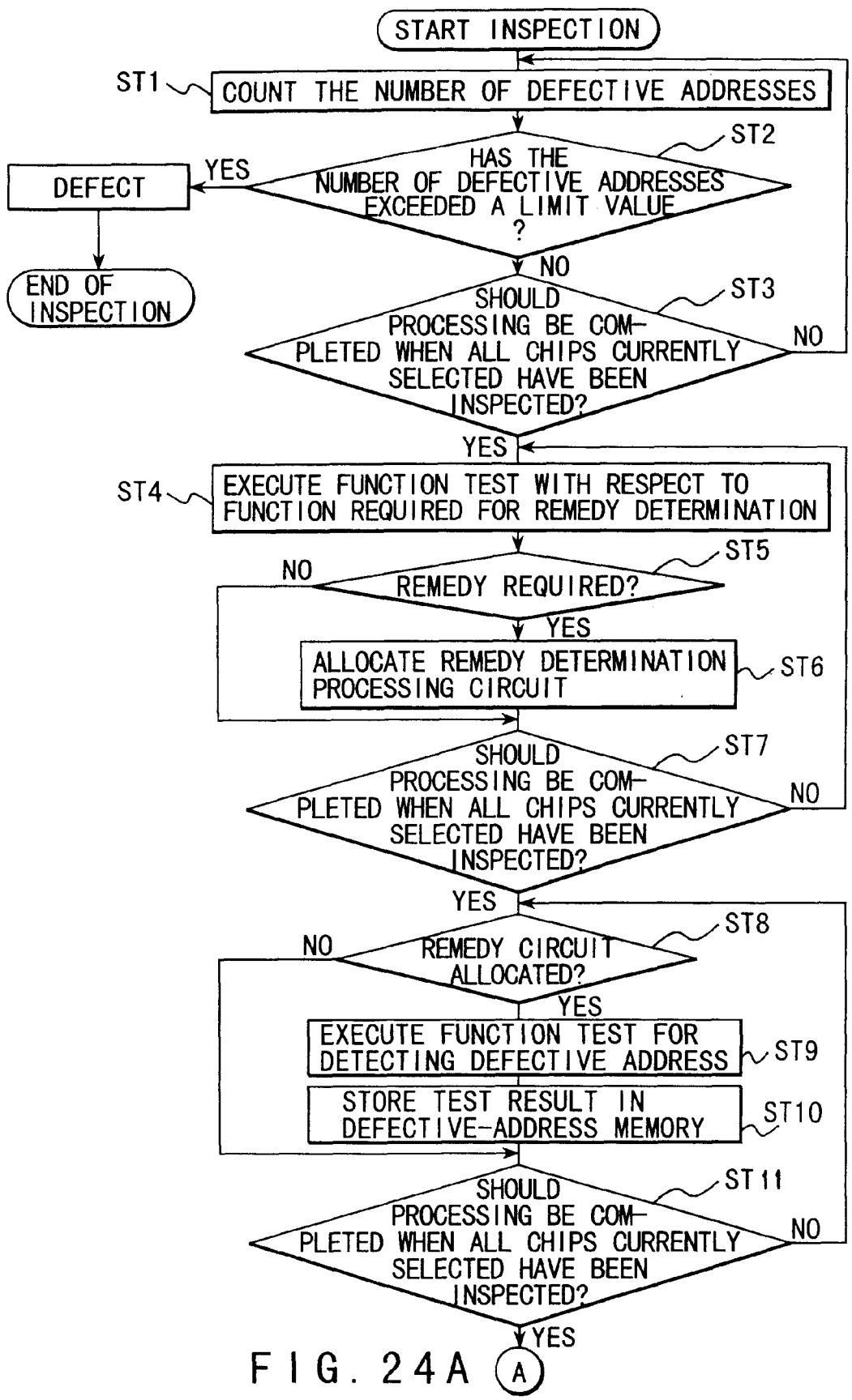
F I G. 24A

METHOD FOR TESTING SEMICONDUCTOR MEMORY DEVICES, AND APPARATUS AND SYSTEM FOR TESTING SEMICONDUCTOR MEMORY DEVICES

This is a continuation of 09/583,015, now U.S. Pat. No. 6,335,209 filed May 30, 2000 which is a divisional of Ser. No. 08/785,288, now U.S. Pat. No. 6,094,733 filed Jan. 23, 1997.

CROSS-REFERENCE TO RELATED APPLICATIONS

This application claims the benefit of priority to Japanese Patent Application No. 8-11029, filed Jan. 25, 1996, which is incorporated by reference.

BACKGROUND OF THE INVENTION

The present invention relates to a method for testing a semiconductor memory which uses redundancy technology, and also to an apparatus designed to test that memory.

Most of the semiconductor devices manufactured at the present time adopt redundancy technology. The adoption of this technology is intended to increase the number of good products manufactured. The redundancy technology is directed to a technique for replacing defective memory cells or defective rows/columns of a main cell array with spare rows/columns. The redundancy technology is useful in remedying defective semiconductor devices, and therefore contributes to an increase in the manufacturing yield of semiconductor memories.

A test for testing a semiconductor device which uses redundancy technology includes three testing items, namely, a DC characteristic test, a function (FNC) test, and redundancy (R/D) analysis. The DC characteristic test is a test for checking the DC characteristic of a semiconductor memory. The FNC test is a test for checking the functions of the semiconductor memory. In the R/D analysis, the location of a defective portion of a main memory cell array is checked on the basis of the results of the FNC test, and an arithmetic operation for replacing the memory cell and row/column at the defective portion with a spare row/column is executed on the basis of the replacement program.

FIG. 1 is a block circuit diagram showing a conventional semiconductor memory tester.

Referring to FIG. 1, the memory tester comprises a memory testing unit 100, an operation terminal 101 for operating the memory testing unit 100, and a test station 150 where a wafer is placed for test. The memory testing unit 100 includes a CPU 102, a main memory 103 which stores a test program (TEST PRG.) and OS, and further stores a replacement program (R/D PRG) used in the arithmetic operation for replacement, a DC characteristic/function tester which outputs test patterns (1) and (2) and an expected value (3), a determination device 105 which compares the expected value (3) with a response signal (4) supplied from a DUT (not shown), determines whether or not the response signal represents a normal state, and supplies determination information (5) to the CPU 102, and a fail memory 107 which stores information (6) regarding the occurrence of an abnormal state when abnormality is detected with respect to the DUT. In FIG. 1, reference numeral (9) denotes control information issued by CPU 102.

The memory tester mentioned above executes a DC characteristic test and an FNC test with respect to the DUT in accordance with the test program. If an abnormal state is detected with respect to the DUT in the test, the information (6) regarding the occurrence of the abnormal state is stored in the fail memory 107.

After the DC characteristic test and the FNC test, the R/D analysis is executed on the basis of the test program. In this analysis, information (7) representing the location of a defective portion of the main memory cell array is extracted from information (6) and read out from the fail memory 107. An operation unit (not shown), included in the CPU 102, analyzes the readout information (7) in accordance with the replacement program and carries out the operation for replacing the defective portion with a spare row/column. Results of this replacement operation (i.e., replacement information RPLC DATA) are used in the redundancy step to check which fuse should be blown by a laser blower. The results of the replacement operation are stored in a storing medium, such as a floppy disk, by means of the operation terminal 101.

The memory tester shown in FIG. 1 serially executes the DC characteristic test, the FNC test, and the R/D analysis. The reason for the serial execution is that the operations described in the test program are executed by a single CPU (CPU 102).

An increase in the memory capacity entails an increase in the number of memory cells, and results in miniaturization of memory cells. In addition, since the internal wiring is of a multi-level structure, the manufacturing process is complicated, accordingly. As shown in FIG. 2, the number of defective memory cells increases in accordance with an increase in the memory capacity. In order to reliably remedy the defective memory cells, the number of spare rows/columns is also increasing, as shown in FIG. 3.

An increase in the memory capacity entails not only an increase in the number of memory cells but also an increase in the number of peripheral circuits, such as row/column decoders. Accordingly, the time needed for testing one DUT is inevitably long.

FIG. 4 shows the relationships between the total test time for one DUT and the memory capacity. FIG. 5 shows the relationships between the total test time for one wafer and the memory capacity. In preparing the data shown in FIG. 5, it was assumed that the total test time for one wafer was equal to the total length of time of the test times for four DUTs. (In actuality, 80 to 130 DUTs correspond to one wafer. Since all DUTs cannot be depicted, they are compressed into four DUTs, for simplicity.)

As shown in FIG. 4, an increase in the test time for one DUT does not become a problem when the memory capacity changes from "1MDRAM" to "4MDRAM". However, when the memory capacity changes from "4MDRAM" to "16MDRAM", the total test time poses a poor throughput problem since it is about twice as long as the total test time of the case of "1MDRAM". To solve this problem, a technique referred to as "multi-probing" is employed to shorten the total test time. The "multi-probing" is specifically a method in which a plurality of DUTs are tested at one time. In FIG. 5, the data corresponding to "16MDRAM" is data obtained when two DUTs are tested at one time. In comparison with the case of "single-probing" (indicated by line I in FIG. 5) where DUTs are tested one by one, the use of the "multi-probing" technique is advantageous in that the total test time required is half. The use of the "multi-probing" technique is advantageous to a certain degree when the memory capacity changes from "16MDRAM" to "64MDRAM". However, when the memory capacity advances to "256MDRAM", the total test time is about twice as long as that of the case of "16MDRAM", as indicated by line II. This being so, it is generally thought that the "expansion of multi-probing" is tried when 256MDRAMs are mass-produced. The "expansion of multi-probing" is to increase the number of DUTs tested at one time. For example, the number of DUTs tested at one time is increased from "32" to "64". The use of the "expansion of multi-probing" shortens the total test time.

The ultimate purpose of the multi-probing is to test all DUTs on a wafer. However, in the cases where the memory capacity is greater than "256MDRAM", there are no DUTs that can be tested at one time, as shown in FIG. 5. In such cases, a decrease in the total test time required for one wafer does not result in any advantage. The total test time for one wafer increases, depending upon the total test time for one DUT.

After the expansion of multi-probing does not produce any advantage, the technique which is available for improving the throughput is merely to increase the number of memory testers employed, thereby enhancing the throughput of the production lines system per unit time.

However, the adoption of this technique is disadvantageous in that a large number of costly memory testers are newly required and that the existing production lines have to be modified or new production lines have to be installed. Such facility investment greatly increases the manufacturing cost of one semiconductor memory device.

In recent years, a new testing method is proposed wherein the DC characteristic test and FNC test for a DUT are executed independently of the R/D analysis.

This proposal is made, for example, in "Guidebook on Apparatuses for Manufacturing And Testing Apparatuses", Kogyo Chosakai, 1996 and Tsunehiro Satou et al., "Tester for Memories", Dec. 4, 1995, Page 152, From Left Column, Line 30 to Right Column, Line 12.

FIG. 6 is a block circuit diagram showing an example of a memory tester which executes the R/D analysis independently of the D/C characteristic test and the FNC test. FIG. 7 is a graph showing the data obtained by the memory tester shown in FIG. 6, and the data in the graph represents the relationships between the total test time for one wafer and the memory capacity. In FIG. 6, the same reference numerals as in FIG. 1 are used to denote corresponding structural elements. In preparing the data shown in FIG. 7, it was assumed that the total test time for one wafer was equal to the total length of time of the test times for four DUTs, as in the data shown in FIG. 5.

As can be seen from the data corresponding to "1MDRAM" in FIG. 7, the DC characteristic test and FNC test are first performed for DUT1, and then the R/D analysis is executed by use of a device designed exclusively for R/D analysis. To cope with these procedures, the CPU 102 of the memory tester shown in FIG. 6 reads out information (7) indicative of the location of a defective portion of the main memory cell array from the fail memory 105, and supplies the readout information (7) to device 151 designed exclusively for R/D analysis. Device 151 analyzes the information (8) received from the CPU 102 on the basis of the replacement program (R/D PRG.), and executes an arithmetic operation for using spare rows/columns for replacement. When the R/D analysis is being executed, the memory tester shown in FIG. 6 performs the DC characteristic test and the FNC test with respect to the next DUT2. Results (RPLC DATA) of the arithmetic operation performed by device 151 are fed back to the CPU 102.

The new testing method mentioned above is advantageous in that the R/D analysis for DUT1 is allowed to overlap with the test for DUT2, and the R/D analysis for DUT2 is likewise allowed to overlap with the test for DUT3, as can be seen in FIG. 7. As a result, the total test time is shorter than that of the case indicated by line III (FIG. 5) by the time corresponding to the sum of the overlapping times.

As can be seen from FIG. 7, the R/D analysis time becomes markedly long in accordance with an increase in the memory capacity. This is because the arithmetic operation for remedying the defective memory cells becomes more complex in accordance with an increase in the number of defective memory cells and the number of spare rows/columns. In regard to the testing method, it can be pointed out that the total testing time can be shortened in accordance with an increase in the R/D analysis time.

According to the testing method, however, the R/D analysis for the last DUT does not overlap with the test for another DUT. Accordingly, the total test time for one wafer is lengthened by the time corresponding to the R/D analysis time for the last DUT.

In regard to the testing method, it should be also noted that the total test time cannot be shortened at all if the ultimate purpose of the multi-probing is attained (i.e., if all DUTs on the wafer can be tested at one time). This is due to the absence of the overlap time, and the phenomenon is shown in the data corresponding to the memory capacity of "256M" or higher. That is, the advantage of the testing method is no longer available in the case where the ultimate purpose of the multi-probing is attained, and the total test time for one wafer continues to increase, depending upon the test time for one DUT.

BRIEF SUMMARY OF THE INVENTION

A method for testing a semiconductor device according to an aspect of the present invention comprises: executing a function test on the semiconductor device; executing a DC characteristic test on the semiconductor device; executing a remedy determination process of the semiconductor device, said remedy determination process being performed in parallel to the DC characteristic test; and executing a remedy process on the semiconductor device.

BRIEF DESCRIPTION OF THE SEVERAL VIEWS OF THE DRAWING

FIG. 10 is a perspective view showing how a semiconductor-testing apparatus according to the second embodiment of the present invention is related with a semiconductor wafer;

FIG. 14 is a flowchart describing the testing procedures followed by the semiconductor memory-testing apparatus of the second embodiment;

FIG. 17 is a flowchart describing the testing procedures according to the third modification;

FIGS. 21A and 21B are flowcharts describing the testing procedures followed by the semiconductor-testing apparatus of the third embodiment;

FIG. 24A and 24B are flowcharts describing the testing procedures followed by the semiconductor-testing apparatus of the third embodiment.

DETAILED DESCRIPTION OF THE INVENTION

Figure 8:
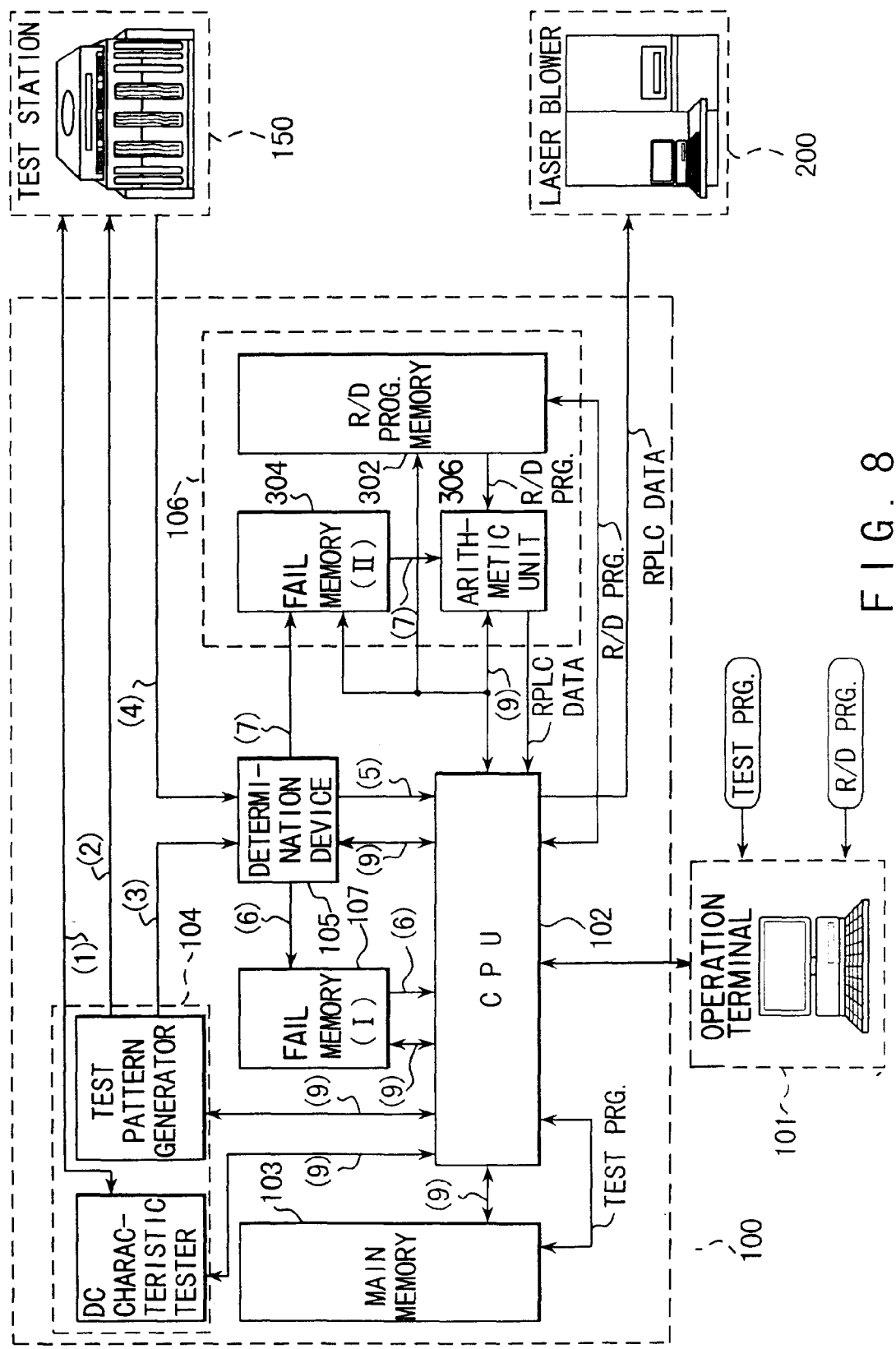
FIG. 8 is a block circuit diagram showing a testing apparatus according to one embodiment of the present invention.

FIG. 8 is a block circuit diagram showing a semiconductor memory device according to the first embodiment of the present invention.

Referring to FIG. 8, the memory tester comprises a memory testing unit 100, an operation terminal 101 for operating the memory testing unit 100, and a test station 150 where a wafer is placed for test. The memory testing unit 100 includes a CPU 102, a main memory 103 which stores a test program (TEST PRG.) and OS, a DC characteristic/function tester which outputs test patterns (1) and (2) and an expected value (3), a determination device 105 which compares the expected value (3) with a response signal (4) supplied from a DUT (not shown), determines whether or not the response signal represents a normal state, and supplies determination information (5) to the CPU 102, and a fail memory (I) 107 which stores information (6) regarding the occurrence of an abnormal state when abnormality is detected with respect to the DUT. The memory tester further comprises a redundancy analyzer 106 for analyzing redundancy (R/D). The redundancy analyzer 106 includes a memory 302 which stores a replacement program (R/D PRG.) used in the arithmetic operation for replacement, a fail memory (II) 304 which stores information (7) regarding the occurrence of an abnormal state when abnormality is detected with respect to a DUT, and an arithmetic unit 306 which analyzes information (7) on the basis of the replacement program and executes an arithmetic operation for using spare rows/columns for replacement. In FIG. 8, reference numeral (9) denotes control information supplied from CPU 102.

The testing items of the function test described in the test program are classified into two groups. The testing items of one group are performed for the test (FNC1) of a memory cell array, and the testing items of the other group are performed for the test (FNC2) of a peripheral circuit, such as a row/column decoder. The test program includes commands for controlling the test procedures, such as a command for starting a DC characteristic test and FNC2 test at the end of FNC1 test, for starting R/D analysis in parallel to these tests. The test program is stored in a storage medium, such as a floppy disk, and transferred through the operation terminal 101 and CPU 102 to the main memory 103, where it is stored.

A description will be given of the operation of the memory tester of the first embodiment.

First of all, FNC1 test is performed for a DUT on the basis of the test program. If an abnormal state is detected with respect to the DUT during the FNC1 test, information (7) representing the occurrence of an abnormal state of the main memory cell array is stored in the fail memory (II) 304 and the fail memory (I) 107. Information (7) stored.

Next, the DC characteristic test the FNC2 test are performed for the DUT on the basis of the test program. In parallel to these tests, information (7) representing the location of a defective portion of the main memory cell array is read out from the fail memory (II) 304, and supplied to the arithmetic unit 306. The arithmetic unit 306 analyzes the readout Information (7) on the basis of the replacement program and executes an operation for using spare rows/columns for replacement. Results of this replacement operation (i.e., replacement information RPLC DATA) are used in the redundancy step to check which fuse should be blown by a laser blower 200 (an example of a remedying device). For this use, the results of the replacement operation are supplied to the laser blower 200. Alternatively, the results of the replacement operation may be stored in a storing medium, such as a floppy disk, by means of the operation terminal 101.

When the arithmetic unit 306 is executing the operation, the DC characteristic test and the FNC2 test are performed with respect to the DUT.

The memory tester shown in FIG. 8 can perform the R/D analysis in parallel to the DC characteristic test and the FNC2 test, after execution of the FNC1 test. This is because the memory tester comprises the redundancy analyzer 106.

Figure 9:
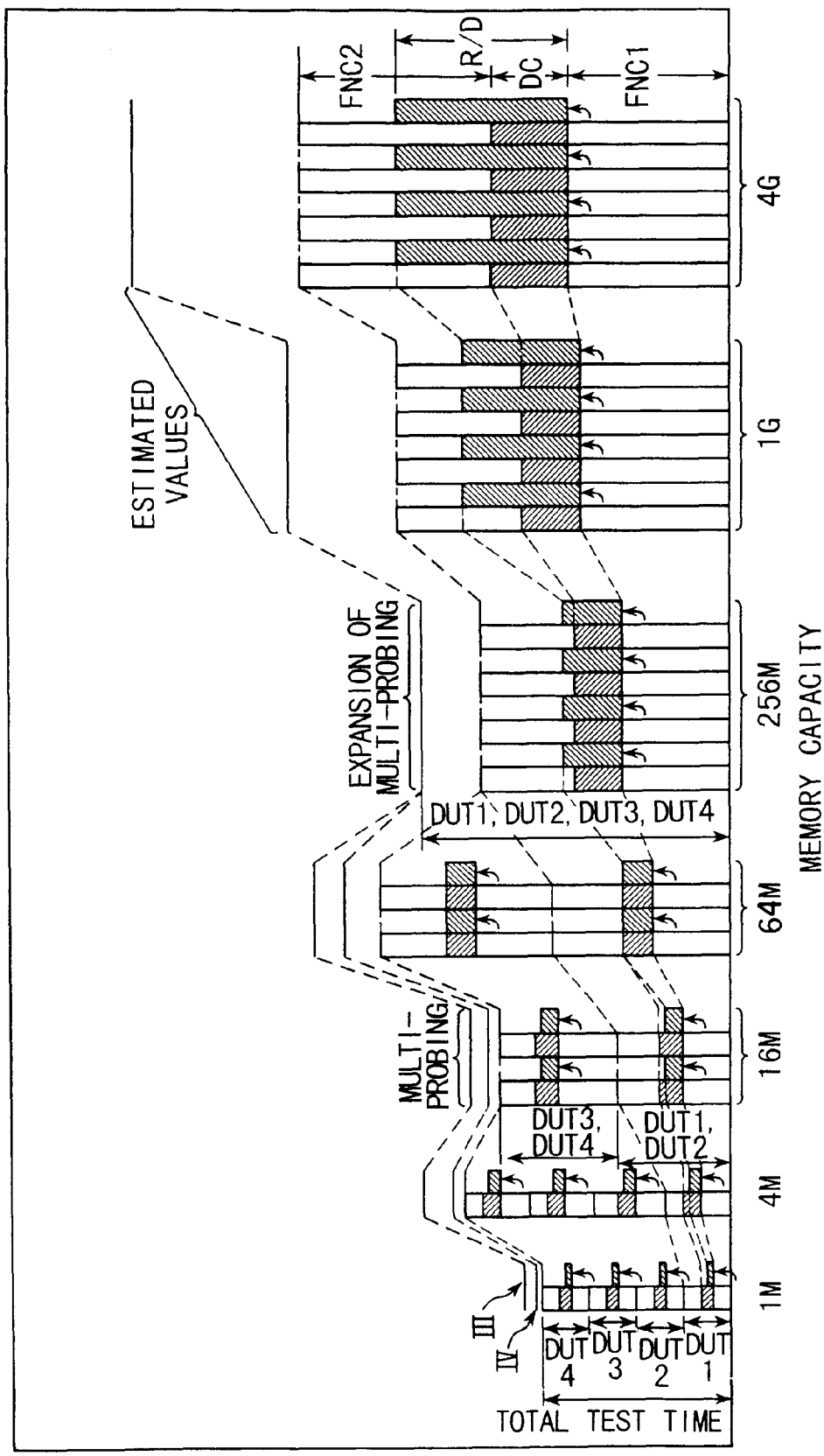
FIG. 9 is a graph showing the relationships between the total test time for one wafer and the memory capacity.

FIG. 9 is a graph showing the data obtained by the memory tester of the first embodiment, and the data in the graph represents the relationships between the total test time for one wafer and the memory capacity. In preparing the data shown in FIG. 9, it was assumed that the total test time for one wafer was equal to the total length of time of the test times for four DUTs. (In actuality, 80 to 130 DUTs correspond to one wafer. Since all DUTs cannot be depicted, they are compressed into four DUTs, for simplicity.)

Figure 1:
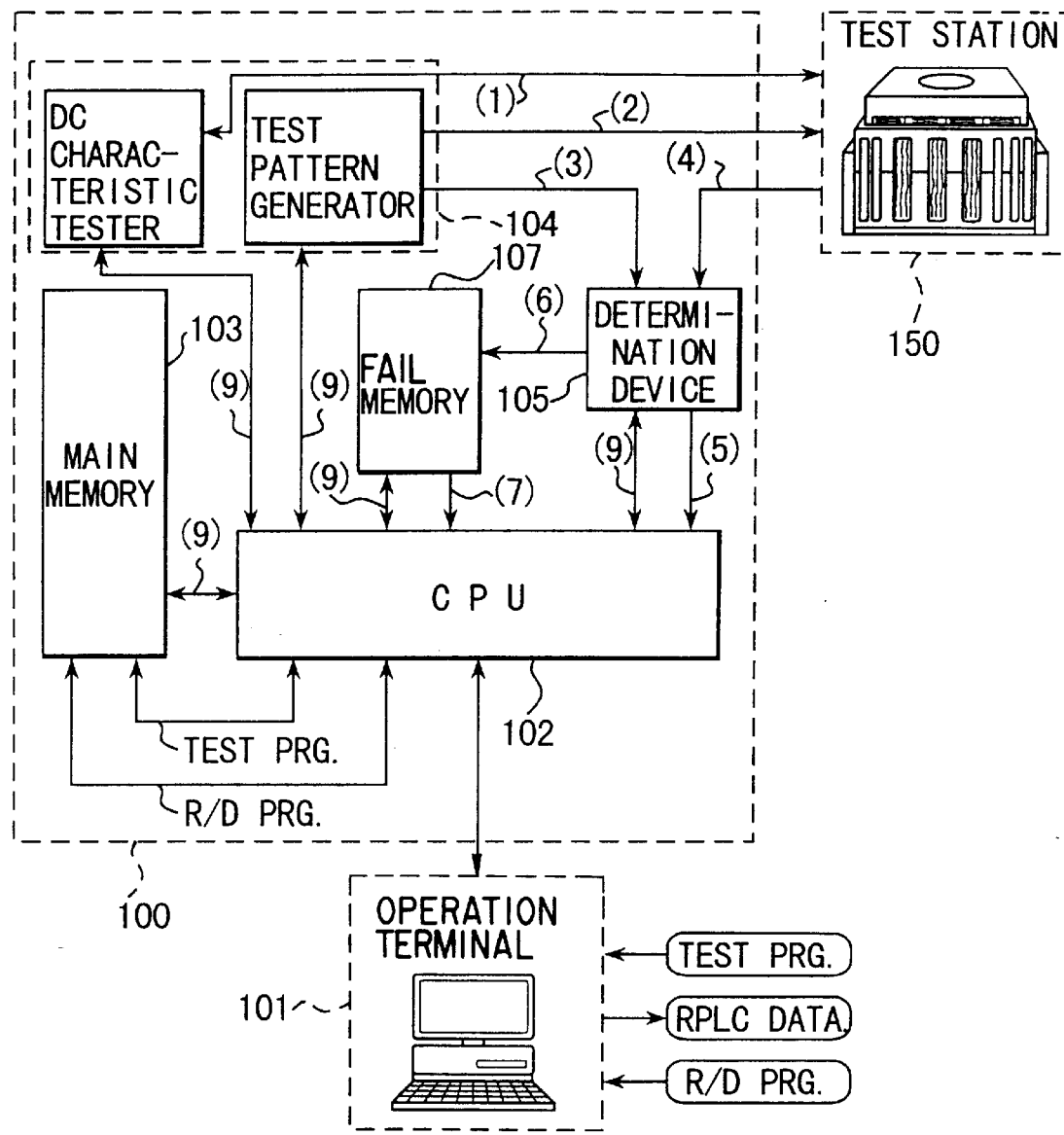
FIG. 1 is a block circuit diagram showing a conventional semiconductor memory tester.
Figure 2:
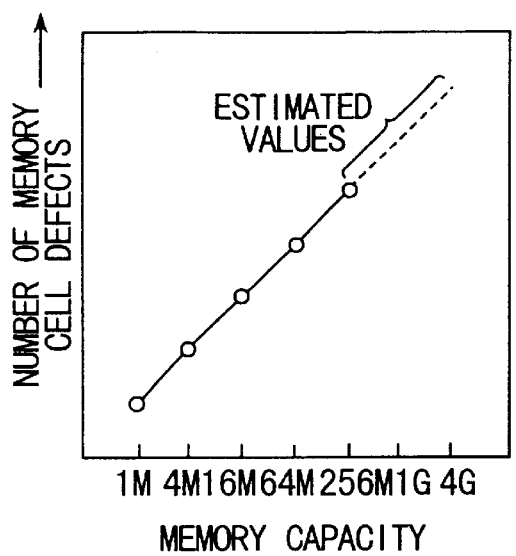
FIG. 2 is a graph showing the relationships between the memory capacity and the number of defective memory cells.
Figure 3:
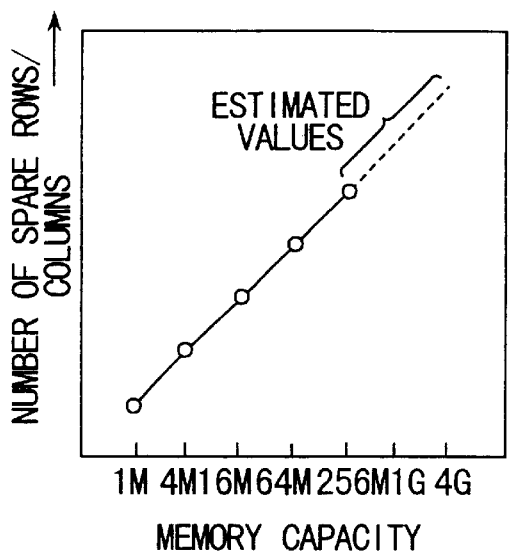
FIG. 3 is a graph showing the relationships between the memory capacity and the number of spare rows/columns.
Figure 4:
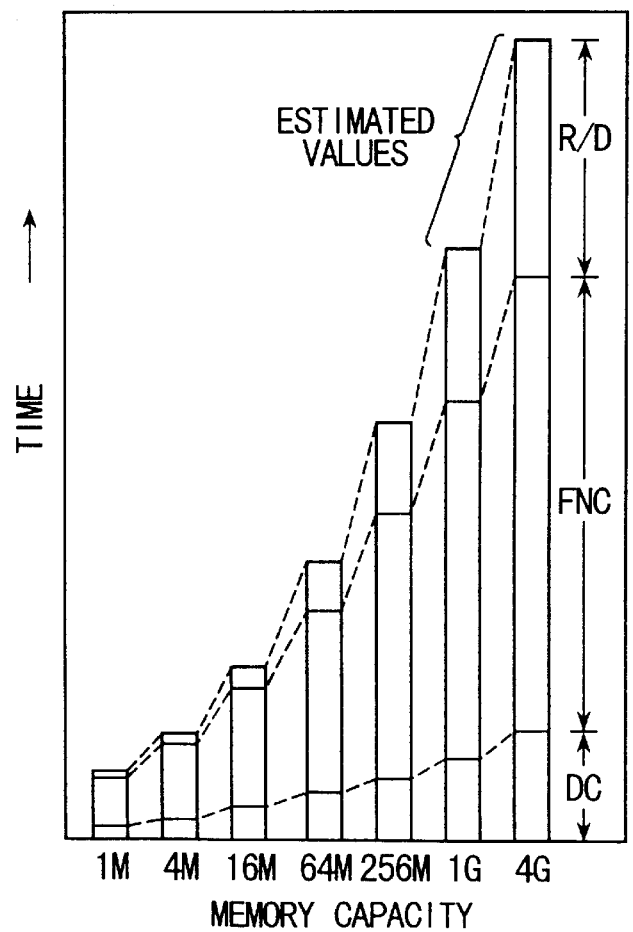
FIG. 4 is a graph showing the relationships between the total test time for one DUT and the memory capacity.
Figure 5:
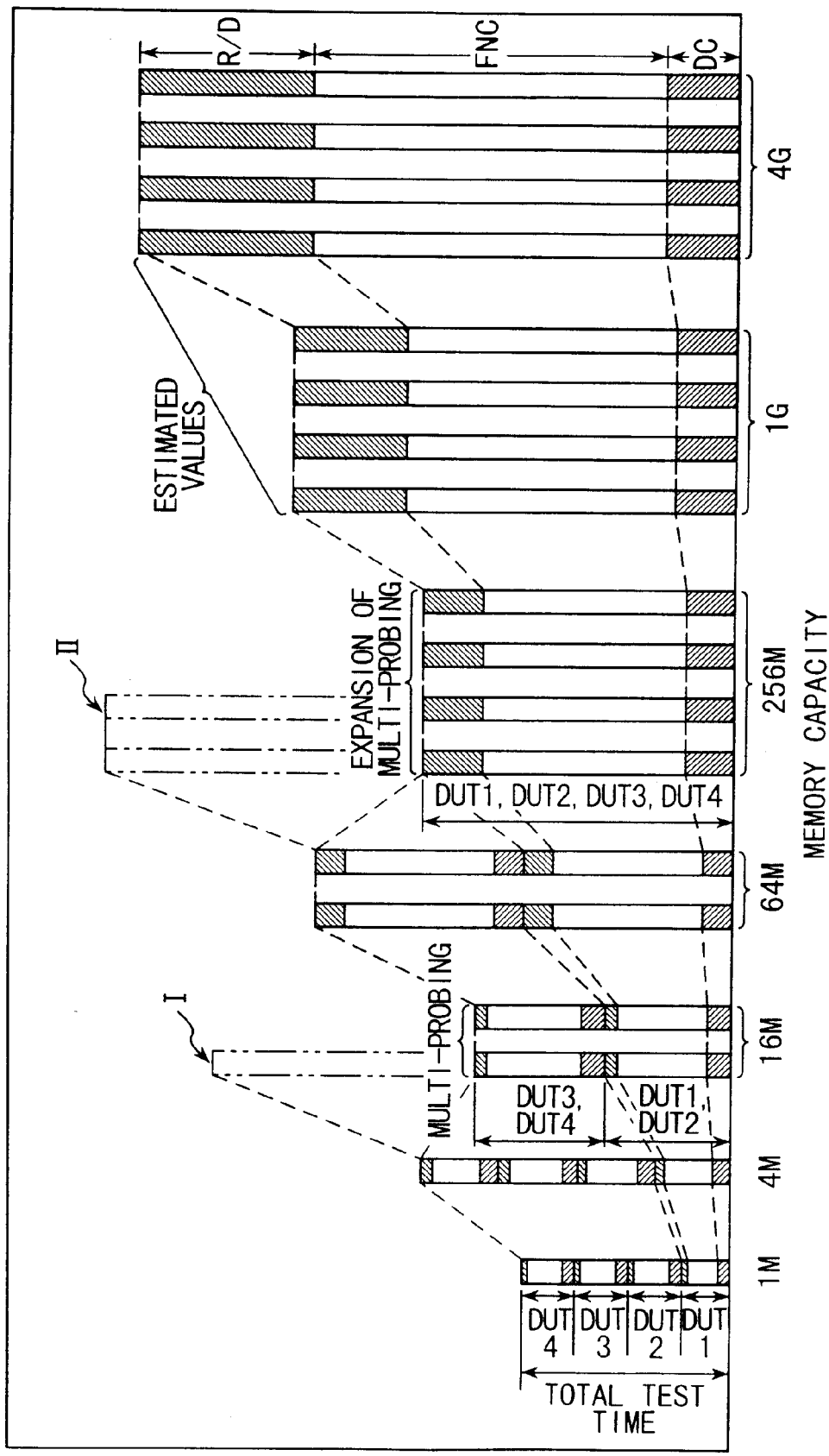
FIG. 5 is a graph showing the relationships between the total test time for one wafer and the memory capacity.
Figure 7:
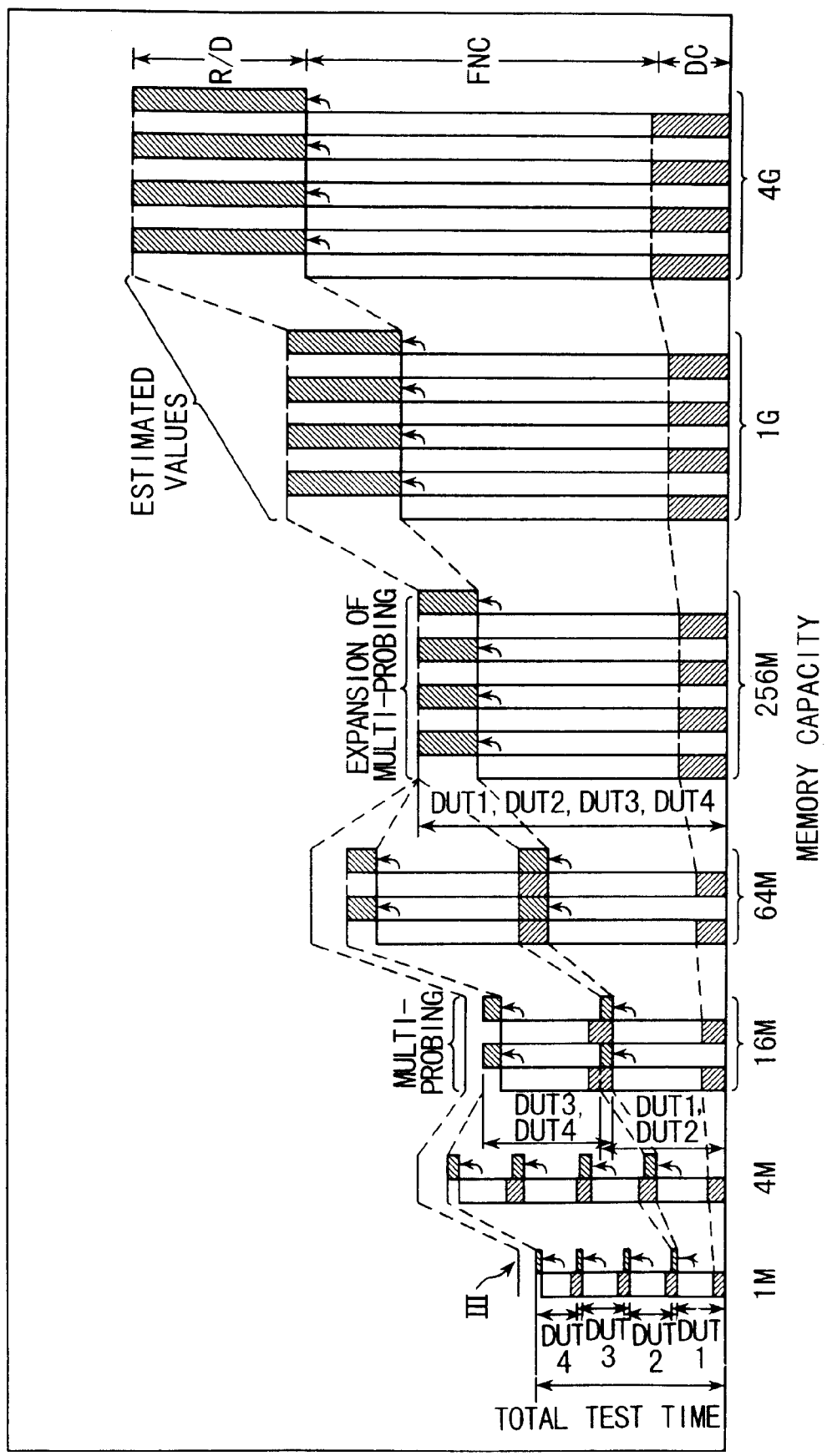
FIG. 7 is a graph showing the relationships between the total test time for one wafer and the memory capacity.

According to the testing method used by the memory tester of the first embodiment, the R/D analysis, included in the testing items of DUT1, is allowed to overlap with the DC characteristic test and FNC2 test for DUT1, as can be seen in FIG. 9. Likewise, the R/D analysis for DUT2 is allowed to overlap with the DC characteristic test and FNC2 test for DUT2. Accordingly, the total test time of the testing method is very short in comparison with the total test times of the prior art. For example, it is shorter than the total test time of the prior art (FIG. 5) indicated by line III by the sum of the R/D analysis times, and is shorter than the total test time of the prior art (FIG. 7) indicated by line IV by the time corresponding to the R/D analysis for the last DUT.

According to the above testing method, the advantage of shortening the total test time is available even if the ultimate purpose of the redundancy analysis is attained (i.e., if all DUTs on a wafer can be tested at one time). As shown in the data corresponding to the memory capacity of "256M" or higher, the total testing time is shortened by the time corresponding to the R/D analysis. This effect becomes more marked in accordance with an increase in the redundancy analysis time.

As described above, the testing method mentioned above is advantageous in that the effect of shortening the total test time is still available even if ultimate or ideal multi-probing is performed. In consideration of this, it is desirable that the testing method be applied to the case where all DUTs on a wafer are tested at one time.

Figure 11:
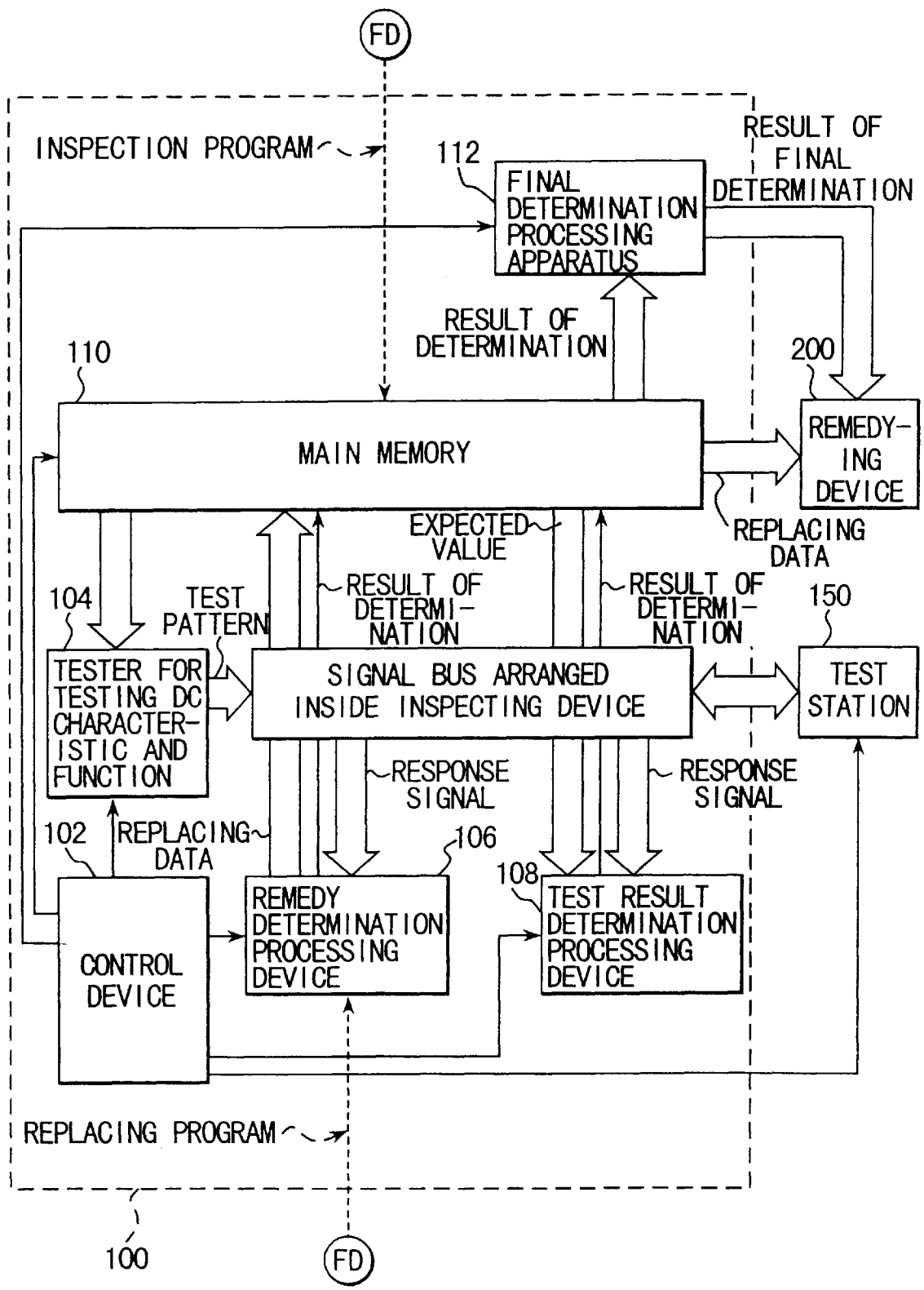
FIG. 11 is a block circuit diagram showing the semiconductor-testing apparatus of the second embodiment.
Figure 12:
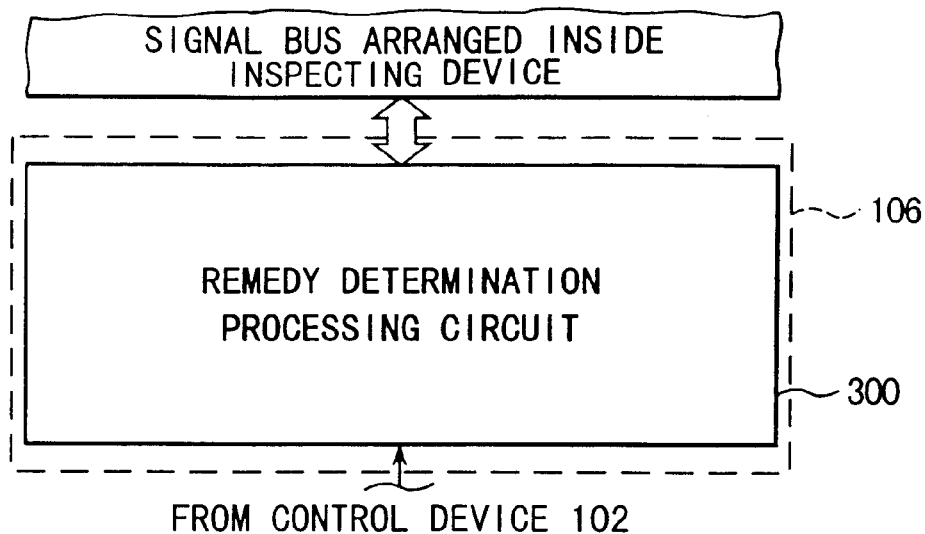
FIG. 12 is a block circuit diagram including a remedy determination processor.
Figure 13:
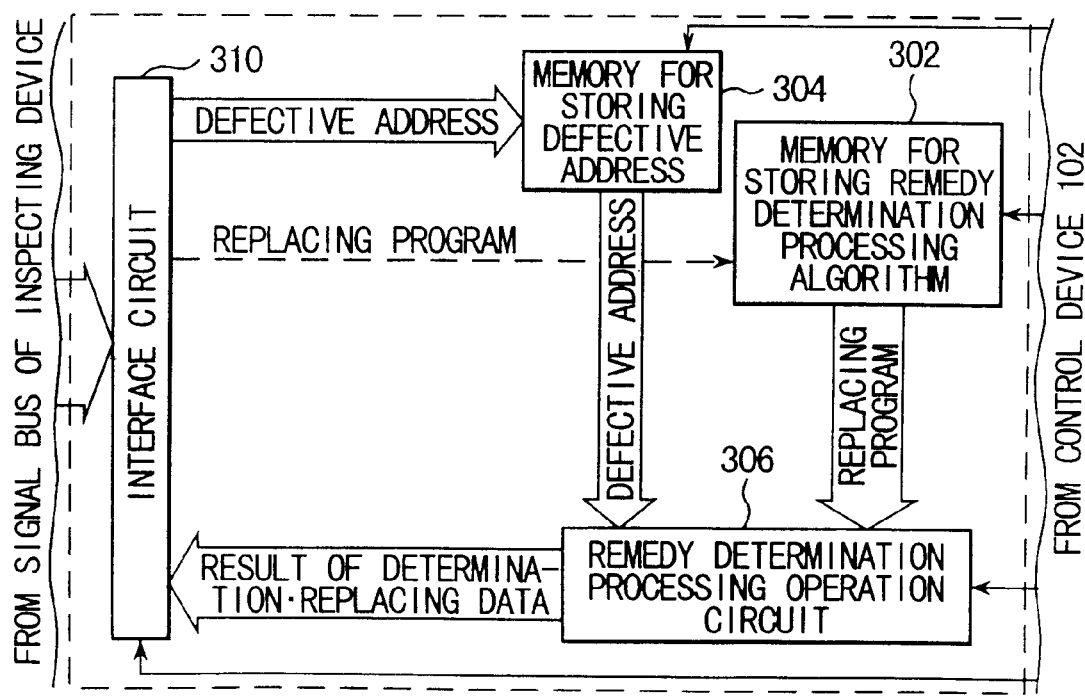
FIG. 13 is a block circuit diagram showing the detailed configuration of the remedy determination processor.

FIG. 10 is a perspective view showing how a memory tester according to the second embodiment of the present invention is related with a semiconductor wafer. FIG. 11 is a block circuit diagram showing the memory tester of the second embodiment. FIG. 12 is a block circuit diagram including a remedy determination processor. FIG. 13 is a block circuit diagram showing the internal configuration of the remedy determination processor. FIG. 14 is a flowchart describing the testing procedures followed by the memory tester of the second embodiment.

As shown in FIG. 10, a tester 100 is connected to a test station 150. The test station 150 receives a test pattern output from the tester 100 and supplies this test pattern to semiconductor memory device (DRAM) chips 170 on which semiconductor memory devices, such as dynamic RAMs, are integrated. In addition, the test station 150 receives response signals from the chips 170 and supplies them to the tester 100.

As shown in FIG. 11, the tester 100 comprises the following structural elements: a DC characteristic/ function testing unit 104 for testing the chips 170 shown in FIG. 10; a remedy determination processor 106 for determining whether or not a DUT can be measured; a test result determination processor for comparing a response signal which a DUT issues in response to the DC characteristic/ function test with the corresponding expected value and for making determination concerning the DC characteristic/ function test; a main memory for storing a test program used for operating the memory tester 100, results of determination output from the determination processors 106 and 108, replacing data obtained by the determination processor 106, etc.; a final determination processor 112 making final determination on the basis of the results of determination obtained by the determination processors 106 and 108; and a control device 102 for controlling these structural elements on the basis of the test program.

As shown in FIG. 12, the remedy determination processor 106 of the memory tester 100 includes a remedy determination processing circuit 300. The processing circuit 300 is controlled by the control device 102 on the basis of the test program.

As shown in FIG. 13, the remedy determination processing circuit 300 includes: a memory 302 for storing remedy determination processing algorithms (replacement programs); a memory 304 for storing the defective address corresponding to the DUT detected in the function test; a remedy determination processing operation circuit 306 for performing an operation used for replacing the defective address with a spare row and column on the basis of the replacement program and for determining whether or not the DUT can be remedied, on the basis of the results of the operation; and an interface circuit 310 for connecting the processing circuit 300 to the internal signal bus of the memory tester 100. These circuit elements are controlled on the basis of the test program by the control device 102.

The operation of the memory tester shown in FIG. 11 will be described with reference to the flowchart shown in FIG. 14.

First of all, the test program is loaded in the main memory 110 of the memory tester 100, and the replacement program is loaded in the remedy determination processing algorithm memory 302. Different test programs and different replacement programs are prepared for the respective types of semiconductor devices, and are stored in storage media, such as floppy disks.

As indicated in step 1 in FIG. 14, the DC characteristic/ function testing unit 104 selects only the function test required for the DUT remedy determination from among a number of function tests, and executes the selected function test. (Of the function test items to be executed for the DUT, the test item required for the DUT remedy determination is executed.) The test pattern of this function test and the control data regarding the expected value are included in the test program. An example of the function test is a function test for detecting and identifying a defective address. To be more specific, data is written in each area of the semiconductor memory device (DUT), and is then read out therefrom. If the written data and the readout data are different, then the corresponding address is regarded as defective. Information required for the DUT remedy determination can be obtained by detecting the defective address in this fashion. Information regarding the defective address is written in the defective-address memory 304 and 108. This function test is executed for each of the addresses of the DUT.

After the function test, step 2 is executed. In this step, preparations are made for the DC characteristic test, the remaining function tests (remaining function test items), and the remedy determination parallel processing. Subsequently, the parallel processing is executed.

As indicated in step 3, the DC characteristic test and the remaining function tests are executed by the testing unit 104. The test pattern of the DC characteristic test, the control data on the related expected value, the test patterns of the remaining function tests, and the control data on the related expected values, are included in the test program.

In parallel to step 3, step 4 is executed. In step 4, the remedy determination processor 106 executes remedy determination processing. In this processing, the defective address detected in step 1 and stored in memory 304 is replaced with a spare row and column on the basis of the replacement program stored in memory 302, and replacing data is produced. The operation needed for the replacement is executed by remedy determination processing operation circuit 306. On the basis of the results of replacement, the operation circuit 306 determines whether or not the DUT can be remedied.

After the end of steps 3 and 4, step 5 is executed. In this step, the final determination processor 112 makes final determination. This final determination is based on the results of the determination made by determination processor 108 (the determination results represent whether or not the DUT has passed the required tests) and the results of the determination made by determination processor 106 (the determination results represent whether or not the DUT can be remedied.

If the final determination results show that at lest one of "FAIL" and "REMEDY IMPOSSIBLE" is applied to the DUT ("NO"), then the DUT is regarded as defective in step 6. If the final determination results show that both "PASS" and "REMEDY POSSIBLE" are applied to the DUT ("YES"), then step 7 is executed with respect to the DUT.

In step 7, the remedying device 200 executes remedy processing. On the basis of the replacing data obtained by remedy determination processor 106, the remedying device 200 executes the processing with respect to the DUT to which "PASS" and "REMEDY POSSIBLE" are applied in the final determination.

The remedying device 200 may be a laser blower, for example. The laser blower blows fuses included in the redundancy circuit of the DUT on the basis of the replacing data, thereby programming the replacing data in the DUT.

Alternatively, the remedying device 200 may be a program writer.. The program writer writes information in the PROM or EEPROM included in the redundancy circuit of the DUT on the basis of the replacing data, thereby programming the replacing data in the DUT.

After the remedy processing, processing continues in accordance with the known testing procedures.

The memory tester of the second embodiment of the present invention can execute the remedy determination processing in parallel to the DC characteristic test and the remaining function tests, as shown in FIG. 11. Since, therefore, the time required for the remedy determination processing overlaps with the time for the DC characteristic test and the remaining function tests, the apparent time for the remedy determination processing is "0". (Since the time for the remedy determination processing can be included in the time for the DC characteristic test and the remaining function tests, no particular time need not be assigned to the remedy determination processing.) Like the memory tester of the first embodiment, the memory tester of the second embodiment can shorten the time required from the start of the test to the remedy processing, and the time required in the second embodiment is shorter than the corresponding times of the conventional art shown in FIGS. 5 and 7. Accordingly, the throughput is enhanced.

In addition, since the apparent time for the remedy determination processing is "0", each memory tester can execute much processing in a unit time. In short, the efficiency of each memory tester is high. Therefore, the throughput of each production line can be improved with no need to increase the number of memory testers employed. Hence, a large number of costly memory testers need not be newly purchased, the existing production lines need not be modified, and new production lines need not be installed. The burden of facility investment is thus lighter than that of the prior art.

The memory tester of the second embodiment enhances the throughput without greatly increasing the manufacturing cost of one semiconductor memory device chip.

The memory tester of the second embodiment can be operated in the manner mentioned below.

Figure 15:
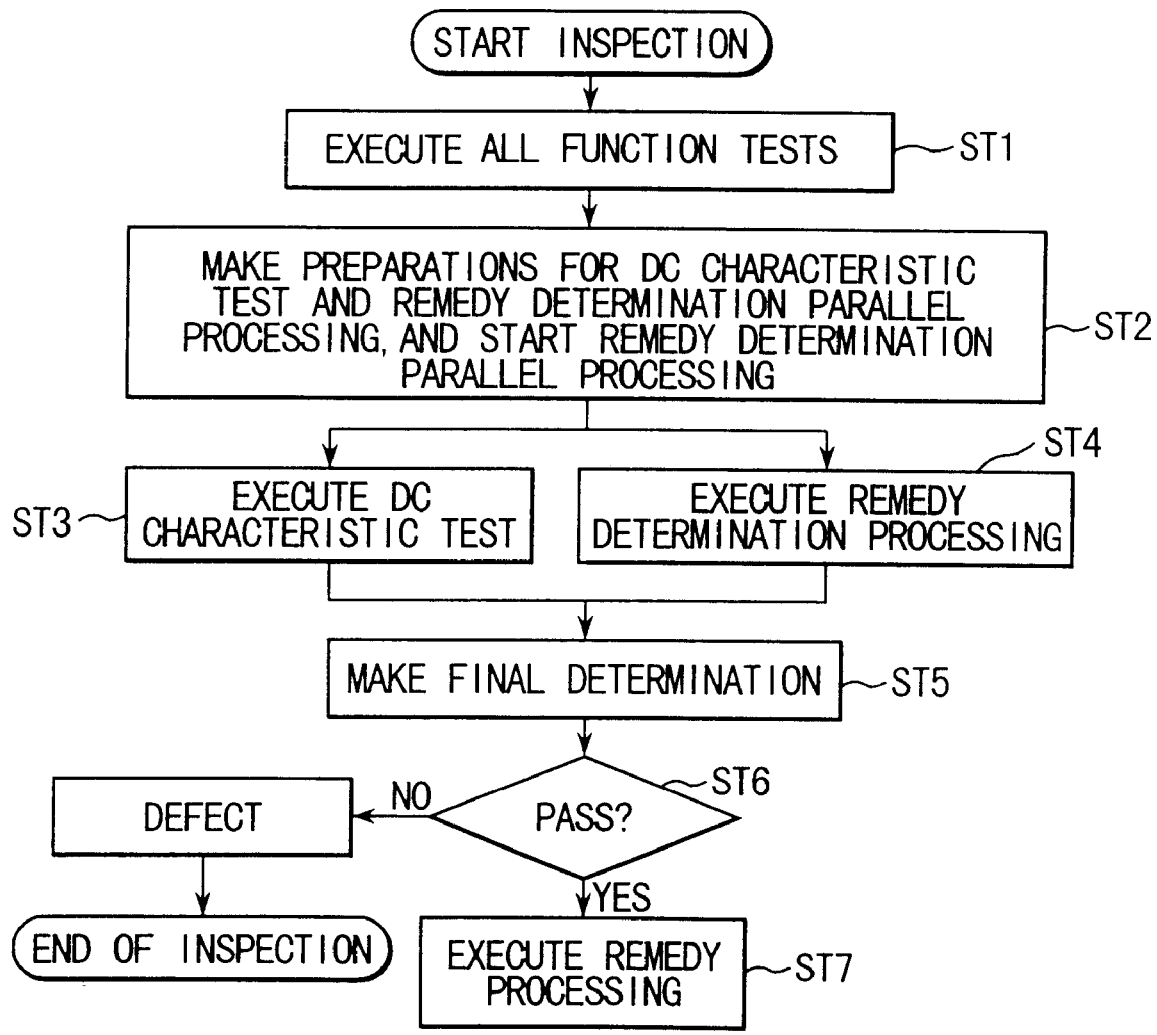
FIG. 15 is a flowchart describing the testing procedures according to the first modification.

FIG. 15 is a flowchart describing the testing procedures according to the first modification.

The testing procedures shown in FIG. 15 differ from those shown in FIG. 14, in that the DC characteristic test (step 3) and the remedy determination processing (step 4) are executed in parallel after all function tests (all function testing items to be performed for a DUT) are executed in step 1.

When the memory tester of the second embodiment is operated in the manner shown in FIG. 15, the test program is altered such that the function tests and the DC characteristic test follow the testing procedures shown in FIG. 15.

In not only the testing procedures shown in FIG. 14 but also the testing procedures shown in FIG. 15, the remedy determination processing is executed in parallel to the DC characteristic test. Like the testing procedures shown in FIG. 14, the testing procedures shown in FIG. 15 enable the throughput to be improved without greatly increasing the manufacturing cost of one semiconductor memory device chip.

Figure 16:
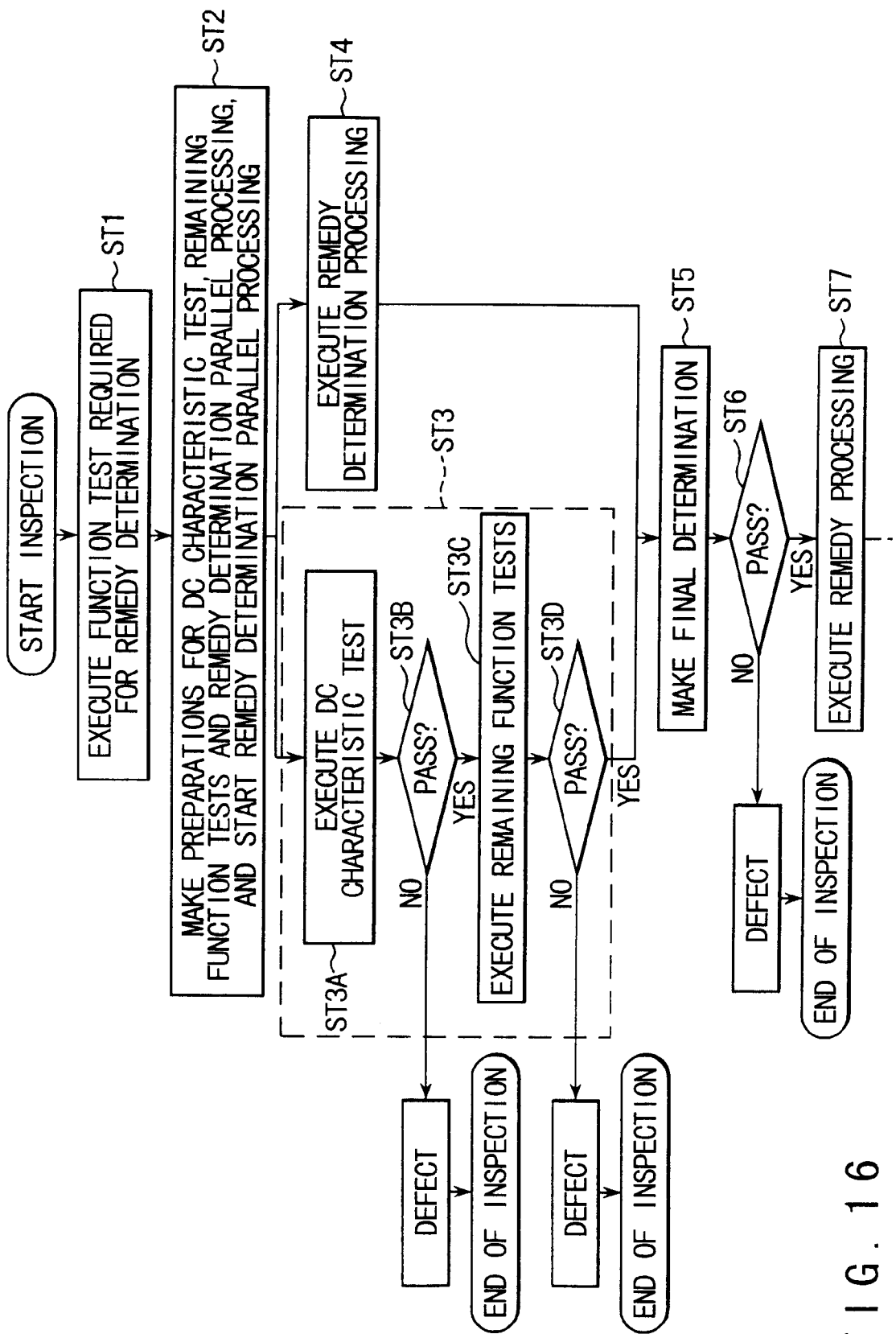
FIG. 16 is a flowchart describing the testing procedures according to the second modification.

FIG. 16 is a flowchart describing the testing procedures according to the second modification.

The testing procedures shown in FIG. 16 differ from those shown in FIG. 14 in the following two points: (i) After the DC characteristic test (step 3A), a check for determining whether or not "PASS" is applied to a DUT is made in step 3B on the basis of the results of determination of the test result determination processor 108. Step 3C is executed only for a DUT to which "PASS" is applied. (ii) After the remaining function tests (step 3C), a check for determining whether or not "PASS" is applied to a DUT is made in step 3D on the basis of the results of determination of the test result determination processor 108. Step 5 is executed only for a DUT to which "PASS" is applied.

When the memory tester of the second embodiment is operated in the manner shown in FIG. 16, the test program is merely altered in accordance with the testing procedures shown in FIG. 16.

In the testing procedures shown in FIG. 16, a check is first made in step 3B to see whether DUTs have passed the DC characteristic test, and the remaining function tests are executed in step 3C only for those DUTs that have passed the DC characteristic test. Since the remaining the function tests are not performed in vain, the throughput is higher than that of the testing procedures shown in FIG. 15.

FIG. 17 is a flowchart describing the testing procedures according to the third modification.

The testing procedures shown in FIG. 17 differ from those shown in FIG. 15 in the following two points: (i) After the execution of all function tests (step 1A), a check for determining whether or not "PASS" is applied to a DUT is made in step 1B on the basis of the results of determination of the test result determination processor 108. Step 2 is executed only for a DUT to which "PASS" is applied. (ii) After the DC characteristic test (step 3A), a check for determining whether or not "PASS" is applied to a DUT is made in step 3B on the basis of the results of determination of the test result determination processor 108. Step 5 is executed only for a DUT to which "PASS" is applied.

When the memory tester of the second embodiment is operated in the manner shown in FIG. 17, the test program is merely altered in accordance with the testing procedures shown in FIG. 17.

In the testing procedures shown in FIG. 17, a check is first made in step 1B to see whether DUTs have passed all function tests, and step 2 is executed only for those DUTs that have passed all function tests. Since the DC characteristic test and the remedy determination processing are not performed in vain, the throughput is higher than that of the testing procedures shown in FIG. 15.

A memory tester according to the third embodiment of the present invention will be described.

Figure 18:
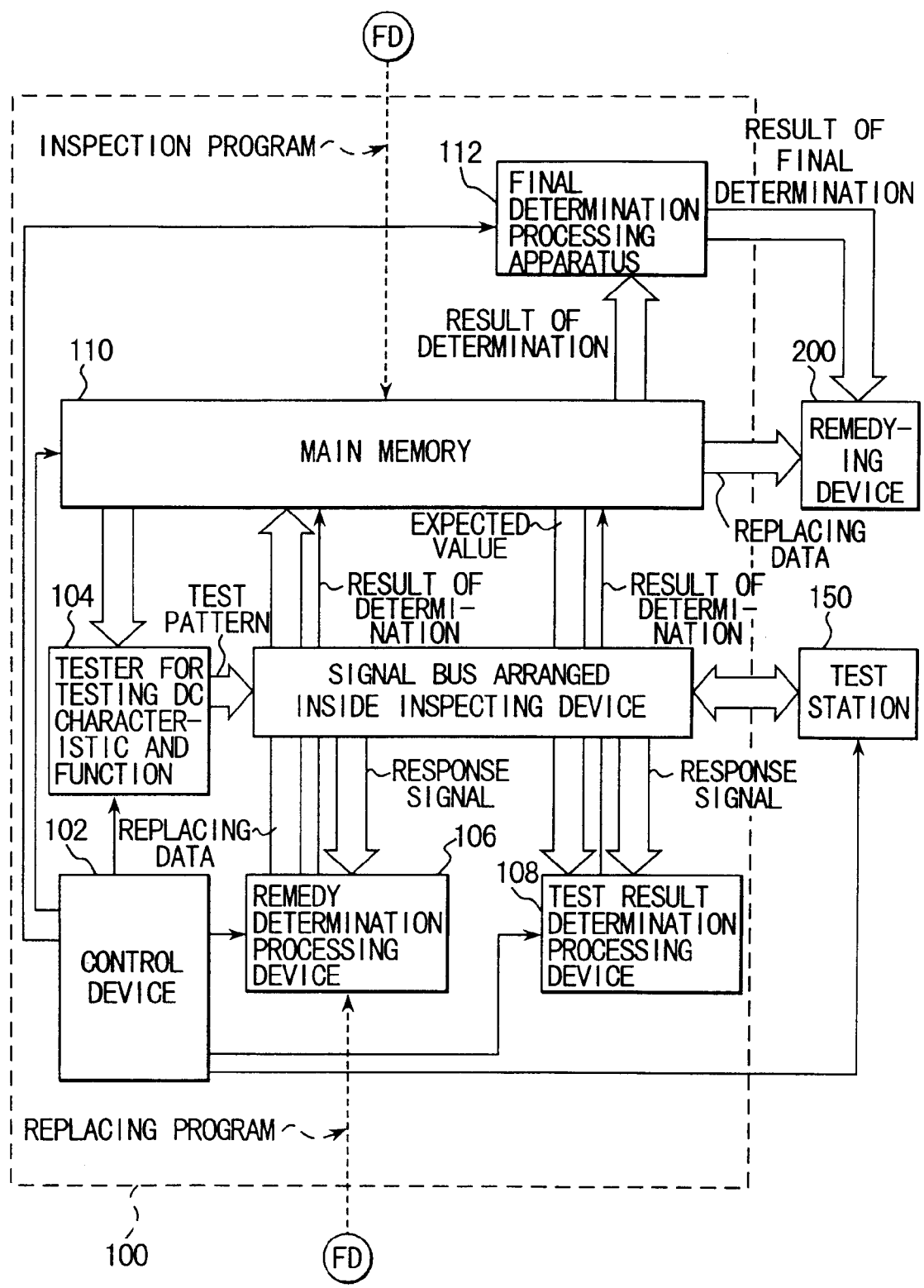
FIG. 18 is a block circuit diagram showing a semiconductor-testing apparatus according to the third embodiment of the present invention.
Figure 19:
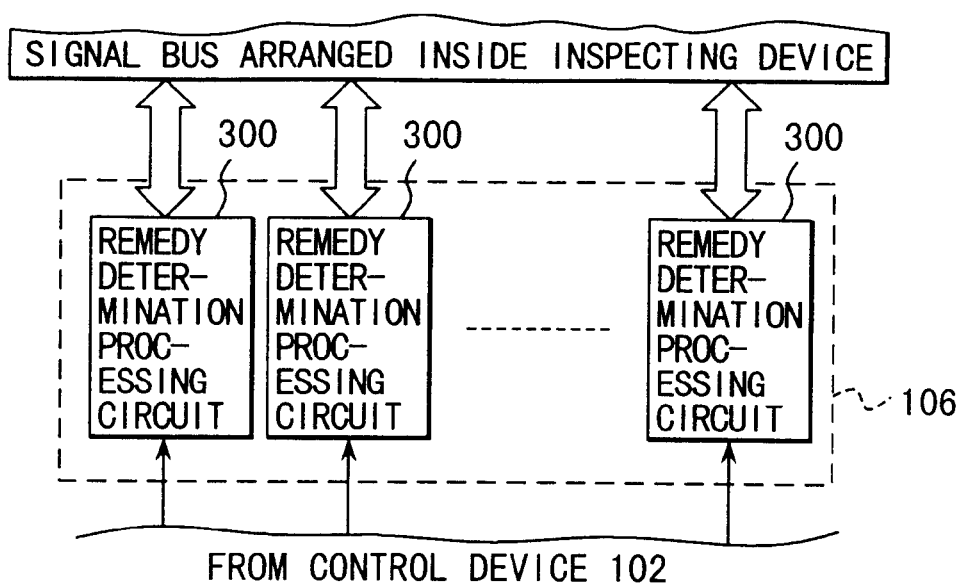
FIG. 19 is a block circuit diagram showing a remedy determination processor.
Figure 20:
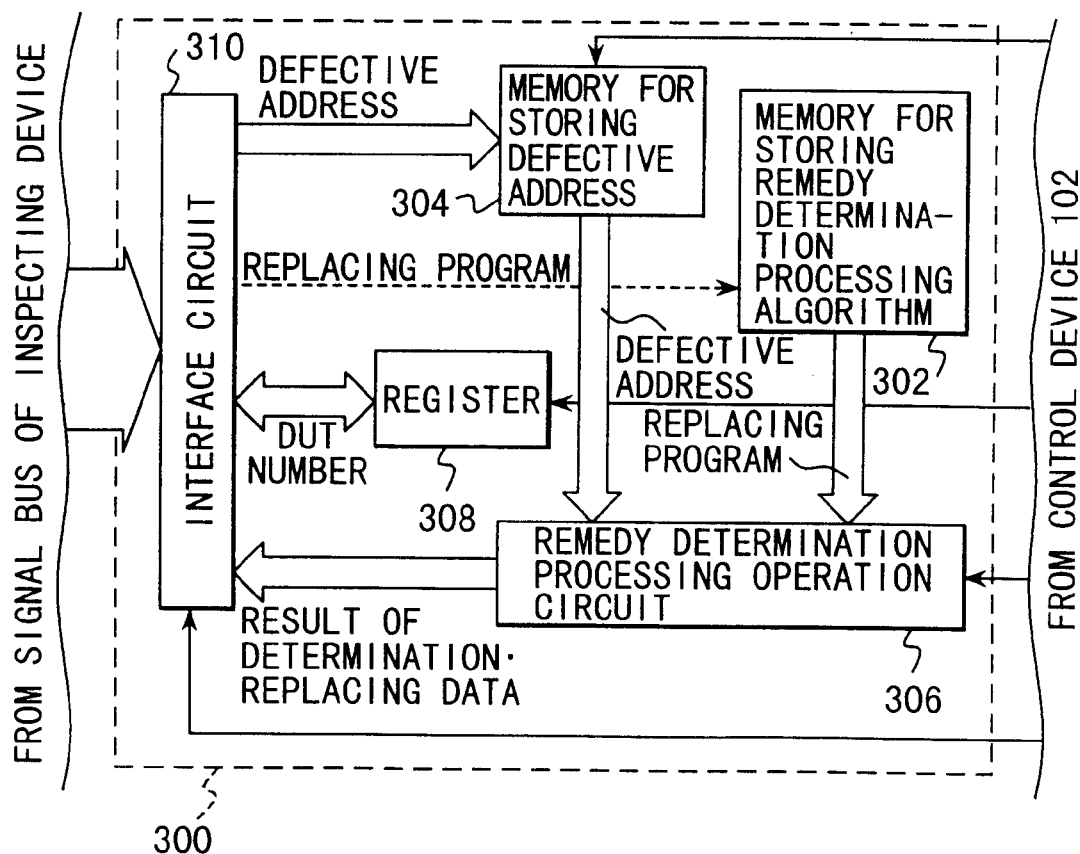
FIG. 20 is a block circuit diagram showing a remedy determination processor.
Figure 21B:
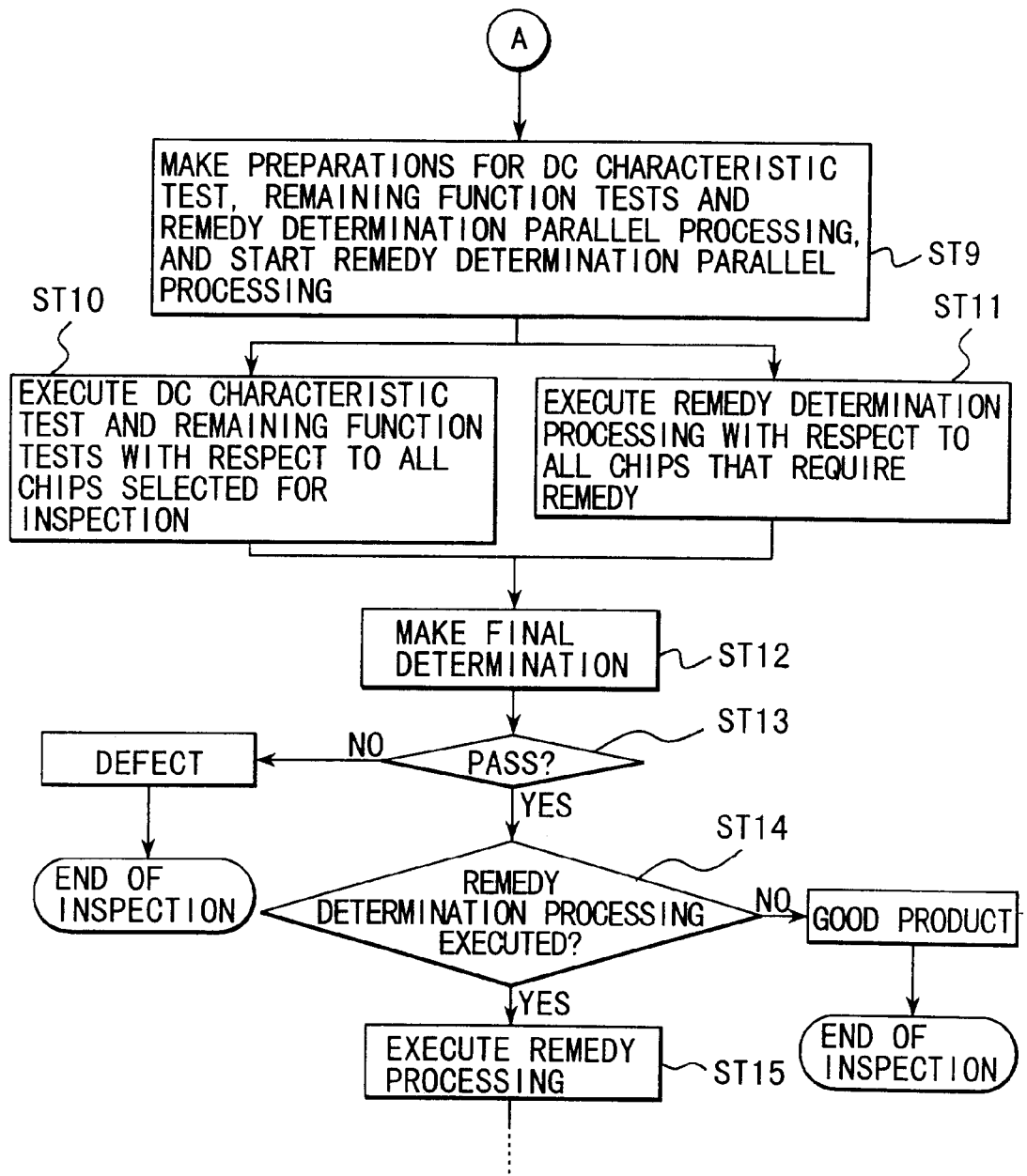

FIG. 18 is a block circuit diagram of the memory tester of the third embodiment. FIG. 19 is a block circuit diagram including a remedy determination processor. FIG. 20 is a block circuit diagram showing the internal configuration of the remedy determination processor. FIGS. 21A and 21B are flowcharts showing testing procedures.

The memory tester of the third embodiment performs remedy determination processing in parallel to the DC characteristic test (and the remaining function tests). In addition, the memory tester performs the remedy determination processing for a number of DUTs at one time, so as to further shorten the time required for the remedy determination processing of each DUT.

As shown in FIG. 18, the memory tester of the third embodiment is similar to that of the first embodiment except for the structure of the remedy determination processor 106.

As shown in FIG. 19, the remedy determination processor 106 of the memory tester of the third embodiment comprises a plurality of remedy determination processing circuits 300. Each of these processing circuits 300 is controlled by the control device 102 on the basis of the test program.

As shown in FIG. 20, each of the remedy determination processing circuits 300 includes: a memory 302 for storing remedy determination processing algorithms (replacement programs); a memory 304 for storing the defective address corresponding to the DUT detected in the function test; a remedy determination processing operation circuit 306 for performing an operation used for replacing the defective address with a spare row and column on the basis of the replacement program and for determining whether or not the DUT can be remedied, on the basis of the results of the operation; a register 308 for storing the number of a DUT to check which DUT is being subjected to the remedy determination processing by the processing circuit 300; and an interface circuit 310 for connecting the processing circuit 300 to the internal signal bus of the memory tester. These circuit elements are controlled on the basis of the test program by the control device 102.

The operation of the memory tester of the third embodiment will be described with reference to the flowcharts shown in FIGS. 21A and 21B.

First of all, the test program is loaded in the main memory 110 of the memory tester 100, and the replacement program is loaded in the remedy determination processing algorithm memory 302 of each remedy determination processing circuit 300.

As indicated in step 1 in FIG. 21A, the DC characteristic/function testing unit 104 selects only the function test required for the DUT remedy determination from among a number of function tests, and executes the selected function test. The test pattern of this function test and the control data regarding the expected value are included in the test program. An example of the function test is a function test for determining whether or not the memory cell array of a semiconductor memory device chip (DUT) includes an abnormal memory cell. To be more specific, the same data is written in each area of the semiconductor memory device (DUT), and is then read out therefrom. If the data read out from the DUT are not completely the same, it is determined that the DUT has to be remedied. Information representing whether or not remedy is required is produced by the test result determination processor 108.

Next, step 2 is executed. In this step, it is determined whether or not remedy is required, on the basis of the results of determination of the test result determination processor 108. If it is determined that remedy is required ("YES" in FIG. 21A), the flow advances to step 3.

In step 3, a DUT which has been determined as requiring remedy is allocated to one of the remedy determination processing circuits 300. The number of the DUT is stored in the register 308. Thereafter, the flow advances to step 4.

If it is determined in step 2 that remedy is not required ("NO" in FIG. 21A), the flow jumps to step 4.

In step 4, it is determined whether the remedy determination processing should be brought to an end when all chips currently selected have been inspected. If it is determined that the processing should be continued ("NO" in FIG. 21A), steps 1–4 are executed for the DUTs to be tested subsequently. If it is determined that the processing should be brought to an end ("YES" in FIG. 21A), the flow advances to step 5.

In step 5, it is determined whether or not a DUT is allotted to one of the remedy determination processing circuits 300. If the DUT is allocated ("YES" in FIG. 21A), the flow advances to step 6.

Figure 6:
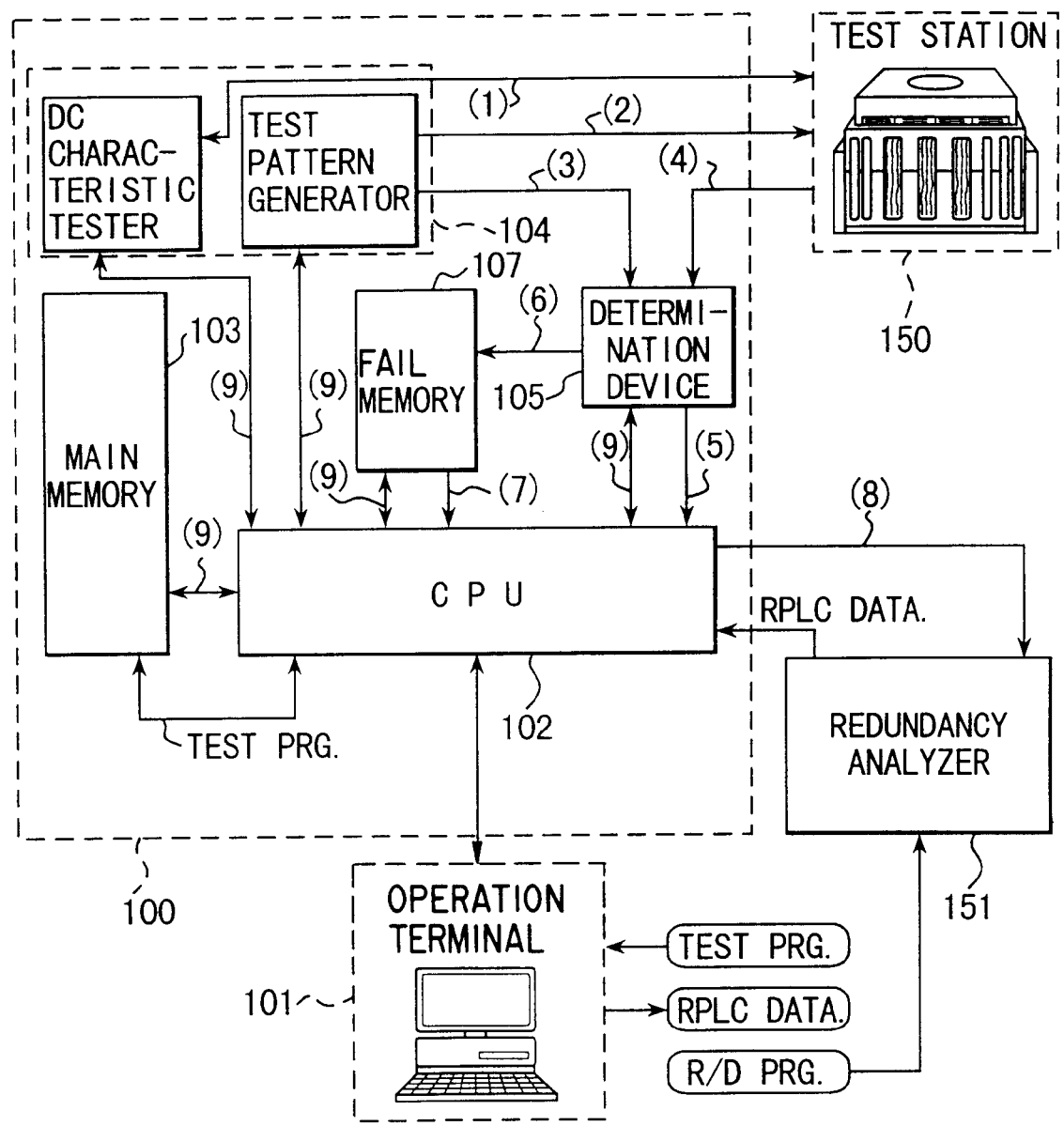
FIG. 6 is a block circuit diagram showing another conventional semiconductor memory tester.

In step 6, the DC characteristic/function testing unit 104 executes the function test required for DUT remedy determination. This function test is similar to the test described in step 1 shown in FIG. 6. The defective-address information obtained in the function test is written in the defective-address memory 304 and 108 in step 7. The function test is performed for each of the addresses of the DUT. Thereafter, the flow advances to step 8.

If it is determined in step 5 that the DUT is not allocated to any of the processing circuits 300 ("NO" in FIG. 21A), the flow jumps to step 8.

In step 8, it is determined whether the defective address-detecting processing should be brought to an end when all chips currently selected have been inspected. If it is determined that the processing should be continued ("NO" in FIG. 21A), steps 5–8 are executed for the DUTs to be tested subsequently. If it is determined that the processing should be brought to an end ("YES" in FIG. 21A), the flow advances to step 9 shown in FIG. 21B.

In step 9 shown in FIG. 21B, preparations are made for the DC characteristic test, the remaining function tests, and the remedy determination parallel processing. Subsequently, the parallel processing is executed.

In step 10, the testing unit 104 executes the DC characteristic test and the remaining function tests.

In parallel to step 10, step 11 is executed. In step 11, the remedy determination processor 106 executes remedy determination processing with respect to all chips that require remedy. In this processing, the defective address detected in step 6 and stored in memory 304 in step 7 is replaced with a spare row and column on the basis of the replacement program stored in memory 302, and replacing data is produced. The operation needed for the replacement is executed by remedy determination processing operation circuit 306. On the basis of the results of replacement, the operation circuit 306 determines whether or not the DUT can be remedied.

After the end of steps 10 and 11, step 12 is executed. In this step, the final determination processor 112 makes final determination. This final determination is based on the results of the determination made by determination processor 108 (the determination results represent whether or not the DUT has passed the required tests) and the results of the determination made by determination processor 106 (the determination results represent whether or not the DUT can be remedied).

If the final determination results show that at lest one of "FAIL" and "REMEDY IMPOSSIBLE" is applied to the DUT ("NO" in FIG. 21B), then the DUT is regarded as defective in step 13. If the final determination results show that both "PASS" and "REMEDY POSSIBLE" are applied to the DUT ("YES" in FIG. 21B), then step 14 is executed with respect to the DUT.

In step 14, a check is made to see whether or not the remedy determination processing has been executed for the DUT. If the remedy determination processing has not been executed ("NO" in step FIG. 21B), the DUT is regarded as a good product. If the remedy determination processing has been executed, step 15 is executed with respect to the DUT.

In step 15, the remedying device 200 executes remedy processing. On the basis of the replacing data obtained by the remedy determination processing circuits 300, the remedying device 200 executes the processing with respect to the DUT to which "PASS" and "REMEDY POSSIBLE" are applied in the final determination.

After the remedy processing, processing continues in accordance with the known testing procedures.

The memory tester of the third embodiment can perform the test in a manner substantially similar to that of the testing procedures shown in FIG. 14. Like the memory testers of the first and second embodiments, the memory tester of the third embodiment is advantageous in that the throughput can be improved without greatly increasing the manufacturing cost of one semiconductor memory device chip.

Since the remedy determination processor 106 comprises a plurality of remedy determination processing circuits 300, the remedy determination processing for one chip can be performed in parallel to the remedy determination processing for another chip. In comparison with the case where they are performed in series, the time needed for the remedy determination processing of all chips can be very short.

Like the memory tester of the second embodiment, the memory tester of the third embodiment can be operated in the manners shown in FIGS. 15, 16 and 17.

A memory tester according to the fourth embodiment of the present invention will be described.

Figure 22:
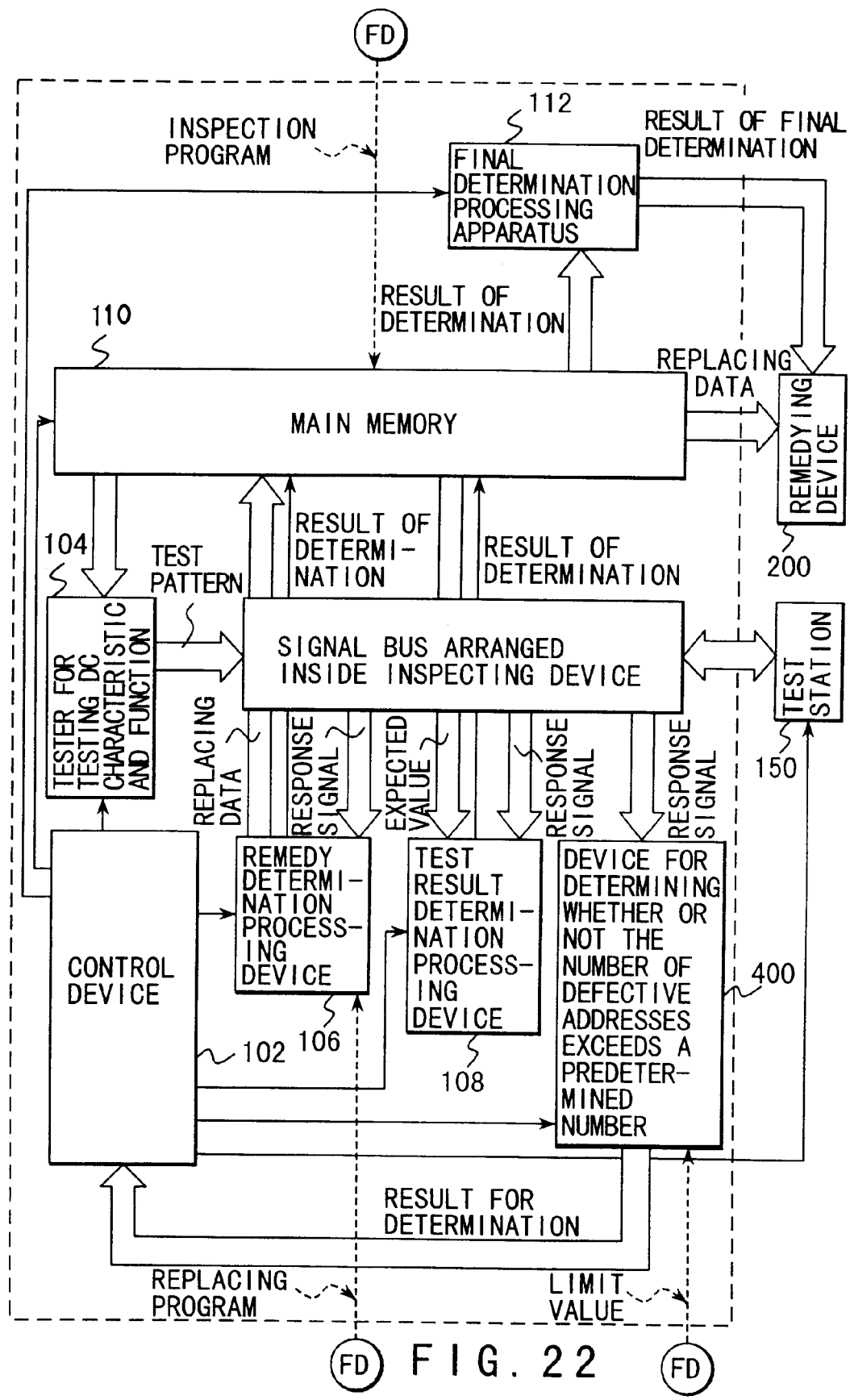
FIG. 22 is a block circuit diagram showing a semiconductor-testing apparatus according to the fourth embodiment of the present invention.
Figure 23:
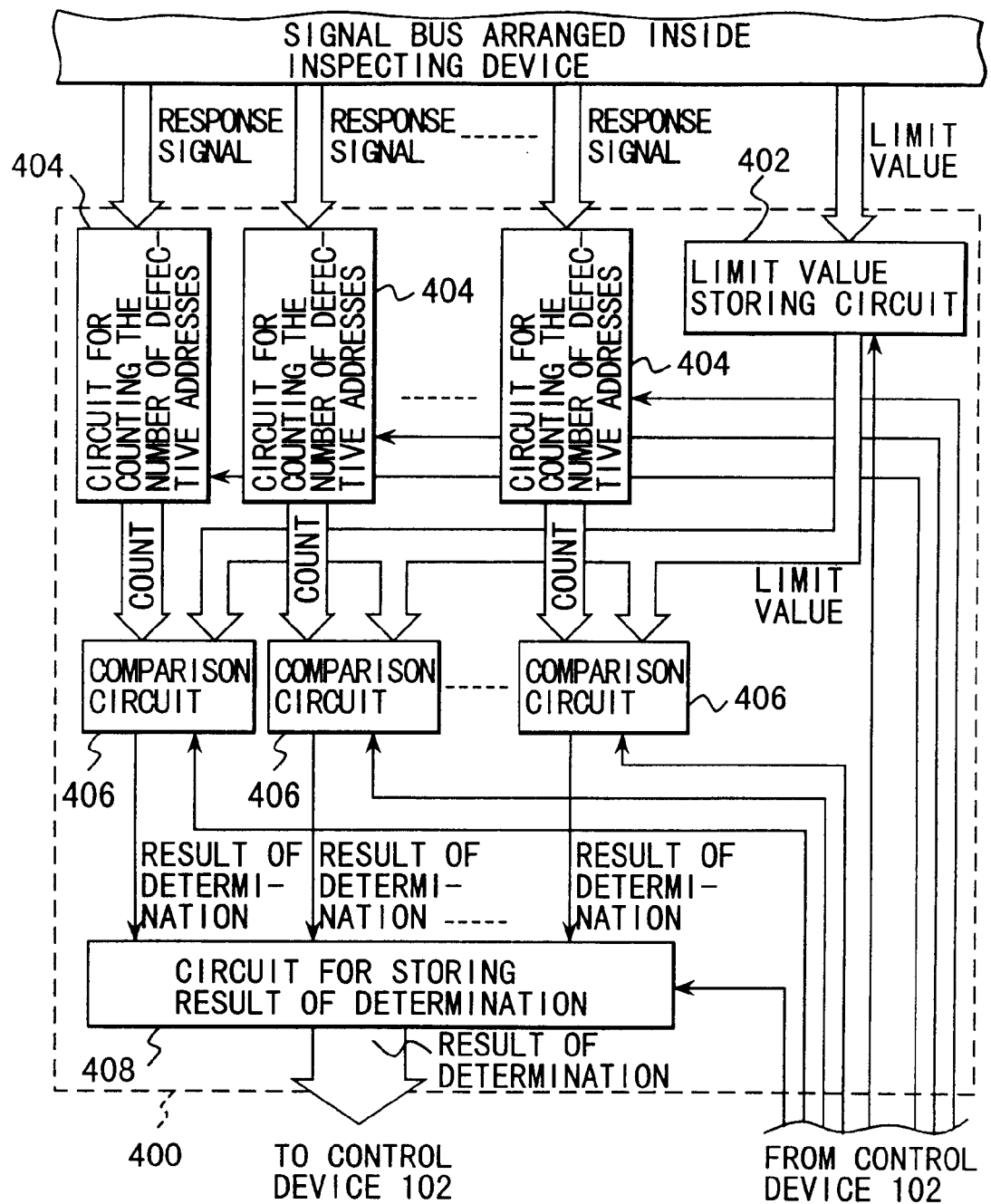
FIG. 23 is a block circuit diagram showing a processor for determining whether the number of defective addresses exceeds a predetermined number.
Figure 24B:
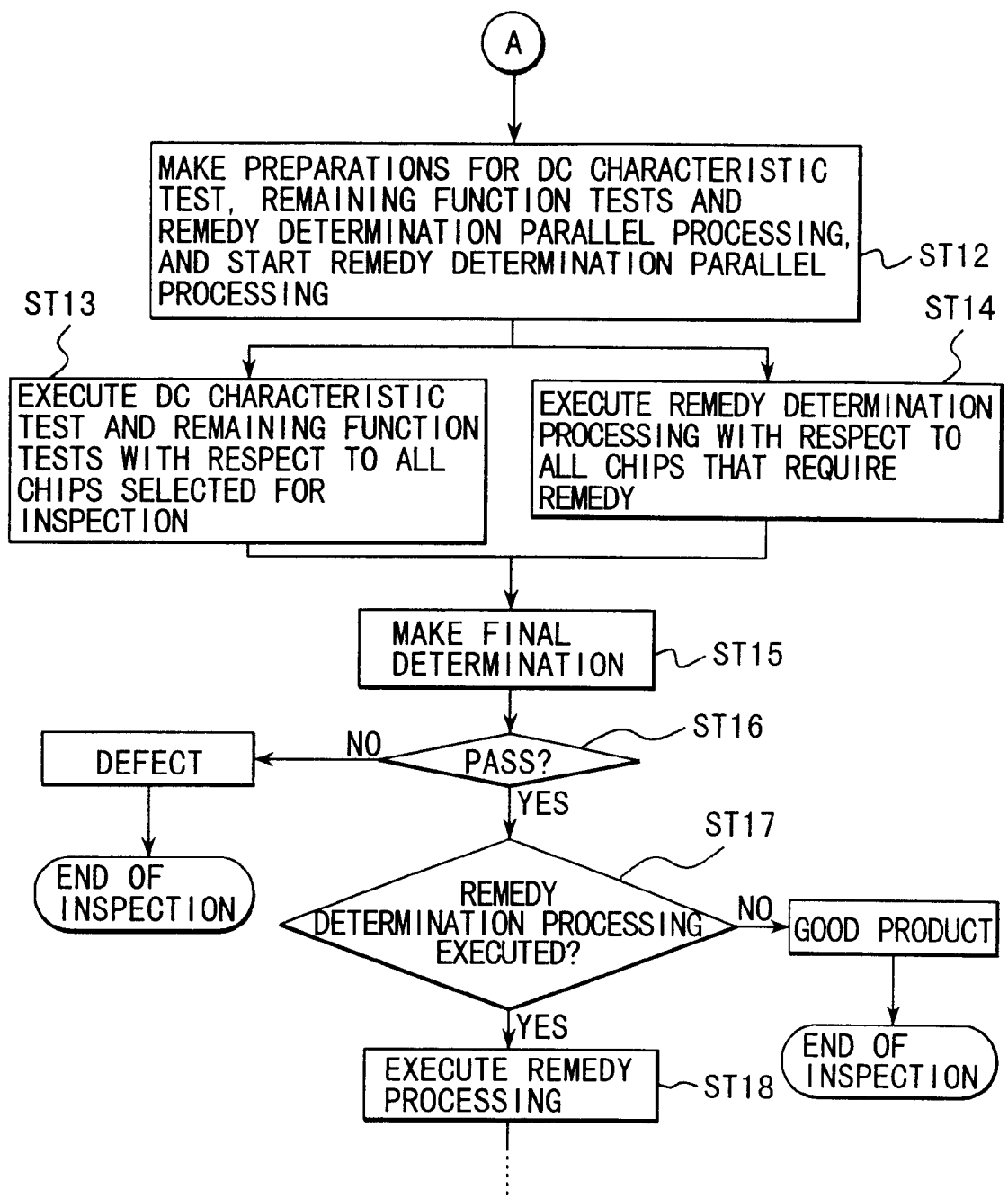

FIG. 22 is a block circuit diagram of the memory tester of the fourth embodiment. FIG. 23 is a block circuit diagram showing a processor for determining whether the number of defective addresses exceeds a predetermined number. FIGS. 24A and 24B are flowcharts showing testing procedures.

The memory tester of the fourth embodiment performs remedy determination processing in parallel to the DC characteristic test (and the remaining function tests). In addition, the memory tester performs a screening test prior to the start of the test, so as to pick out a chip having a very large number of defective addresses. Such a chip is screened out as a chip which cannot be remedied. Accordingly, the total time required for the DC characteristic test and the function tests can be shortened.

As can be seen in FIG. 22, the memory tester of the fourth embodiment is similar to that of the third embodiment in that it further comprises an extra-number determining device 400 for determining whether or not the number of defective addresses exceeds a predetermined number.

As shown in FIG. 23, the extra-number determining device 400 comprises: a limit value storing circuit 402 for holding the limit value of the number of defective addresses; a plurality of defective-address counting circuits 404 each for counting the number of defective addresses of a DUT; a plurality of comparison circuits 406, provided in correspondence to the counting circuits, for comparing the counts of the counting circuits 404 with the limit value held in the storing circuit 402, and for outputting determination results representing whether or not DUTs can be remedied; and a determination result storing circuit 408 for storing the determination results output by the comparison circuits 406. These circuit elements are controlled in accordance with the test program by the control device 102.

The operation of the memory tester of the fourth embodiment will now be described with reference to the flowcharts shown in FIGS. 24A and 24B.

First of all, the test program is loaded in the main memory 110 of the memory tester 100, the replacement program is loaded in the remedy determination processing algorithm memory 302 of each remedy determination processing circuit 300, and a predetermined limit value is loaded in the limit value storing circuit 402.

Then, chips to be tested are allocated to the respective defective-address counting circuits 404.

Next, the DC characteristic/function testing unit 104 selects the function test for defective-address number extraction, with respect to all chips to be tested. An example of the function test is a function test wherein the same data is written in each memory cell of the chip and the written data is then read out therefrom.

As indicated in step I shown in FIG. 24A, each defective-address counting circuit 404 counts the number of defective addresses. This counting operation can be performed, for example, by counting the number of times data different from the written data is output during the function test. The number of defective addresses is counted with respect to each of the chips to be tested.

After the counting operation of the number of defective addresses, step 2 is executed. In this step, each comparison circuit 406 compares the count of the corresponding counting circuit 404 with the limit value, so as to check whether or not the count of each counting circuit 404 exceeds the limit value. If the count exceeds the limit value ("YES" in FIG. 24A), the corresponding DUT is determined as defective. Conversely, if the count does not exceed the limit value ("NO" in FIG. 24A), the flow advances to step 3. The processing executed in step 2 is screening. That is, a chip which has a very large number of defective addresses and cannot be remedied is screened out. The results of screening are stored in the determination result storing circuit 408, and are later supplied to the control device 102 as control data.

In step 3, it is determined whether the screening processing should be brought to an end when all chips currently selected have been inspected. If it is determined that the processing should be continued ("NO" in FIG. 24A), steps 1–3 are executed for the DUTs to be tested subsequently. If it is determined that the processing should be brought to an end ("YES" in FIG. 24A), the flow advances to step 4.

In step 4, the DC characteristic/function testing unit 104 executes the function test for determining whether or not a DUT has to be remedied. In this determination, the results of the test performed in step 1 may be used.

The subsequent operations, i.e., the operations described from step 5 to step 18 (FIG. 21B), are similar to the operations described from step 2 (FIG. 21A) to step 15 (FIG. 21B).

The memory tester of the fourth embodiment can perform the test in a manner substantially similar to that of the testing procedures shown in FIG. 14. Like the memory testers of the first, second and third embodiments, the memory tester of the fourth embodiment is advantageous in that the throughput can be improved without greatly increasing the manufacturing cost of one semiconductor memory device chip.

Like the memory tester of the third embodiment, the remedy determination processor 106 of the memory tester of the fourth embodiment comprises a plurality of remedy determination processing circuits 300. Therefore, the remedy determination processing for one chip can be performed in parallel to the remedy determination processing for another chip. In comparison with the case where they are performed in series, the time needed for the remedy determination processing of all chips can be very short.

In addition, the memory tester of the fourth embodiment comprises an extra-number determining device 400 for determining whether or not the number of defective addresses exceeds a predetermined number. Owing to this device, a chip which has a very large number of defective addresses and cannot be remedied can be screened out. Therefore, the number of chips which are actually tested can be smaller than the number of chips which are to be tested. If the number of chips actually tested can be reduced, the time required for the DC characteristic test and remaining function tests can be shortened. In this point, the memory tester of the fourth embodiment is more advantageous than the memory tester of the third embodiment.

The memory testers of the above embodiments can be modified as below.

The memory testers shown in FIGS. 8, 11, 18 and 22 are a single test station type, wherein a tester is connected to a single test station. Needless to say, however, they may be designed to be a multi test station type, wherein a tester is connected to a number of test stations.

The signals used in the DC characteristic test and function tests and the signals processed in the remedy determination processor 106 and extra-number determining device 400 need not be supplied from a single chip. They may be simultaneously supplied from a plurality of chips.

The remedy determination processing algorithm memory 302 for storing a replacement program may be one of a RAM, a high-speed RAM, an EEPROM and a flash EEPROM. Alternatively, memory 302 may be in the form of a ROM wherein a replacement program is stored by utilization of hardware.

A defective address need not be replaced with a single spare row and a single spare column. It may be replaced with a number of spare rows and spare columns, instead.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for testing a semiconductor device, comprising:
   executing a first function test which detects an abnormal portion of a memory cell array of the semiconductor device;
   executing a DC characteristic test which detects a DC characteristic of the semiconductor device, and executing a second function test different from the first function test;
   checking a location of the abnormal portion of the memory cell array, based on abnormal portion with a spare portion, said arithmetic operation being performed in parallel to both the DC characteristic test and the second function test; and
   executing a remedy process to program replacing data based on results of the arithmetic operation in a redundancy circuit of the semiconductor device.

2. The method according to claim 1, wherein said first function test, said DC characteristic test, said second function test, and said arithmetic operation are executed in parallel when a plurality of semiconductor devices formed on a wafer are tested.

3. The method according to claim 1, wherein said first function test, said DC characteristic test, said second function test, and said arithmetic operation are executed in parallel when all semiconductor devices formed on a wafer are tested.

4. The method according to claim 1, further comprising:
   a determination process which determines whether or not the semiconductor device is a device that can be remedied,
   said remedy process being executed for the device that can be remedied.

5. The method according to claim 4, wherein said determination process is performed by checking whether a number of defective addresses is larger than a predetermined limit number.

6. A method for testing a semiconductor device, comprising:
   executing a first function test which detects an abnormal portion of a memory cell array of the semiconductor device;
   executing a DC characteristic test which detects a DC characteristic of the semiconductor device, and executing a second function test different from the first function test;
   checking a location of the abnormal portion of the memory cell array, based on results of the first function test, and performing an arithmetic operation to replace the abnormal portion with a spare portion, said arithmetic operation being performed in parallel to both the DC characteristic test and the second function test;
   executing a remedy process to program replacing data based on results of the arithmetic operation in a redundancy circuit of the semiconductor device; and
   executing a final function test on the semiconductor device being programmed with the replacing data.

7. The method according to claim 6, wherein said first function test, said DC characteristic test, said second function test, and said arithmetic operation are executed in parallel when a plurality of semiconductor devices formed on a wafer are tested.

8. The method according to claim 6, wherein said first function test, said DC characteristic test, said second function test, and said arithmetic operation are executed in parallel when all semiconductor devices formed on a wafer are tested.

9. The method according to claim 6, further comprising:
   a determination process which determines whether or not the semiconductor device is a device that can be remedied,
   said remedy process being executed for the device that can be remedied.

10. The method according to claim 9, wherein said determination process is performed by checking whether a number of defective addresses is larger than a predetermined limit number.

11. A method for testing a semiconductor device, comprising:

executing a function test required for remedy determination on the semiconductor of device;

executing a DC characteristic test and remaining function test on the semiconductor device;

executing a remedy determination process of the semiconductor device, said remedy determination process being performed in parallel to both the DC characteristic test and the remaining function test; and executing a remedy process on the semiconductor device.

12. The method according to claim 11, wherein said remedy determination process executes at a tester.

13. The method according to claim 11, wherein said remedy process is executed by a tester.

14. The method according to claim 11, wherein said function test, said DC characteristic test, and a remedy determination process are executed in parallel when a plurality of semiconductor devices formed on a wafer are tested.

15. The method according to claim 11, wherein said function test, said DC characteristic test, said remaining function test, and said remedy determination process are executed in parallel when all semiconductor devices formed on a wafer are tested.

16. The method according to claim 11, wherein said remedy determination process includes determining whether or not the semiconductor device is a device that can be remedied, said remedy process being executed for the device that can be remedied.

17. The method according to claim 16, wherein said remedy determination process is performed by checking whether a number of defective addresses is larger than a predetermined limit number.

18. A method for testing a semiconductor device, comprising:

executing a function test on the semiconductor device;

executing a DC characteristic test on the semiconductor device;

executing a remedy determination process of the semiconductor device, said remedy determination process being performed in parallel to the DC characteristic test; and executing a remedy process on the semiconductor device.

19. The method according to claim 18, wherein said remedy determination process executes at a tester.

20. The method according to claim 18, wherein said remedy process is executed by a tester.

21. The method according to claim 18, wherein said function test, said DC characteristic test, and said remedy determination process are executed in parallel when a plurality of semiconductor devices formed on a wafer are tested.

22. The method according to claim 18, wherein said function test, said DC characteristic test, and a remedy determination process are executed in parallel when all semiconductor devices formed on a wafer are tested.

23. The method according to claim 18, wherein said remedy determination process includes determining whether or not the semiconductor device is a device that can be remedied, said remedy process being executed for the device that can be remedied.

24. The method according to claim 13, wherein said remedy determination process is performed by checking whether a number of defective addresses is larger than a predetermined limit number.

* * * * *

UNITED STATES PATENT AND TRADEMARK OFFICE
CERTIFICATE OF CORRECTION

PATENT NO.   : 6,518,073 B2
DATED        : February 11, 2003
INVENTOR(S)  : Momohara It is certified that error appears in the above-identified patent and that said Letters Patent is hereby corrected as shown below:

Column 15,
Line 67, after "based on" insert -- results of the first function test, and performing an arithmetic operation to replace the --.

Signed and Sealed this

Twenty-ninth Day of July, 2003

JAMES E. ROGAN
*Director of the United States Patent and Trademark Office*